(12) United States Patent
Bennion et al.

(10) Patent No.: US 8,541,875 B2
(45) Date of Patent: Sep. 24, 2013

(54) INTEGRATED THREE-DIMENSIONAL MODULE HEAT EXCHANGER FOR POWER ELECTRONICS COOLING

(75) Inventors: Kevin Bennion, Littleton, CO (US); Jason Lustbader, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 185 days.

(21) Appl. No.: 13/249,706

(22) Filed: Sep. 30, 2011

(65) Prior Publication Data
US 2013/0082377 A1 Apr. 4, 2013

(51) Int. Cl.
*H01L 23/34* (2006.01)
*H01L 23/10* (2006.01)

(52) U.S. Cl.
USPC ............ 257/706; 257/E23.105; 257/707; 257/712; 438/122

(58) Field of Classification Search
USPC ............ 257/E23.08, E23.105, 704, 706, 257/707, 712, 720, 796; 438/117, 122, 125; 165/104.13, 170
See application file for complete search history.

(56) References Cited

U.S. PATENT DOCUMENTS

| | | | | |
|---|---|---|---|---|
| 5,528,456 A * | 6/1996 | Takahashi | | 361/704 |
| 5,883,426 A * | 3/1999 | Tokuno et al. | | 257/686 |
| 6,411,513 B1 * | 6/2002 | Bedard | | 361/704 |
| 7,187,553 B2 * | 3/2007 | Schmidberger | | 361/719 |
| 7,230,334 B2 * | 6/2007 | Andry et al. | | 257/713 |
| 7,564,124 B2 * | 7/2009 | Lee et al. | | 257/675 |
| 7,573,727 B2 * | 8/2009 | Hauenstein et al. | | 361/803 |
| 7,839,641 B2 * | 11/2010 | Baba et al. | | 361/711 |
| 7,995,344 B2 * | 8/2011 | Dando et al. | | 361/710 |
| 8,039,973 B2 * | 10/2011 | Morelle et al. | | 257/784 |
| 2002/0015288 A1 * | 2/2002 | Dibene et al. | | 361/711 |
| 2004/0099944 A1 * | 5/2004 | Kimura | | 257/706 |
| 2005/0017350 A1 * | 1/2005 | Corti et al. | | 257/706 |
| 2006/0138646 A1 * | 6/2006 | Aisenbrey | | 257/712 |
| 2010/0237496 A1 * | 9/2010 | Touzelbaev et al. | | 257/712 |

OTHER PUBLICATIONS

"Electrical and Electronics Technical Team Roadmap", Vehicle Technologies Program Plans and Roadmaps, http://www1.eere.energy.gov/vehiclesandfuels/pdfs/program/eett_roadmap_12-7-10.pdf; Dec. 7, 2010, pp. 1-82, accessed Dec. 19, 2011.
Bennion et al., "Rapid Modeling of Power Electronics Thermal Management Technologies", 5th IEEE Vehicle Power and Propulsion Conference, Dearborn Michigan, Sep. 7-11, 2009, pp. 1-10.
Burress et al., "Evaluation of the 2008 Lexus LS 600H Hybrid Synergy Drive System", Oak Ridge National Laboratory Technical Report; ORNL/TM-2008/185, Jan. 2009, pp. 1-91.
Sakai et al., "Power Control Unit for High Power Hybrid System", SAE 2007 World Congress, Detroit, MI Apr. 16-19, 2007, SAE Paper 2007-01-1271, pp. 25-29.
Taylor, "Development, Test and Demonstration of a Cost-Effective, Compact, Light-Weight, and Scalable High Temperature Inverter for HEVs, PHEVs, and FCVs", 2009 DOE Merit Review Presentation, May 21, 2009, pp. 1-20.
Yasui et al., "Power Control Unit for High Power Hybrid System", Proceedings of the EVS 23 Conference, Anaheim, CA Dec. 2-5, 2007, pp. 1-8.

* cited by examiner

Primary Examiner — Chris Chu
(74) Attorney, Agent, or Firm — Paul J. White; John C. Stolpa

(57) ABSTRACT

Embodiments discussed herein are directed to a power semiconductor packaging that removes heat from a semiconductor package through one or more cooling zones that are located in a laterally oriented position with respect to the semiconductor package. Additional embodiments are directed to circuit elements that are constructed from one or more modular power semiconductor packages.

25 Claims, 9 Drawing Sheets

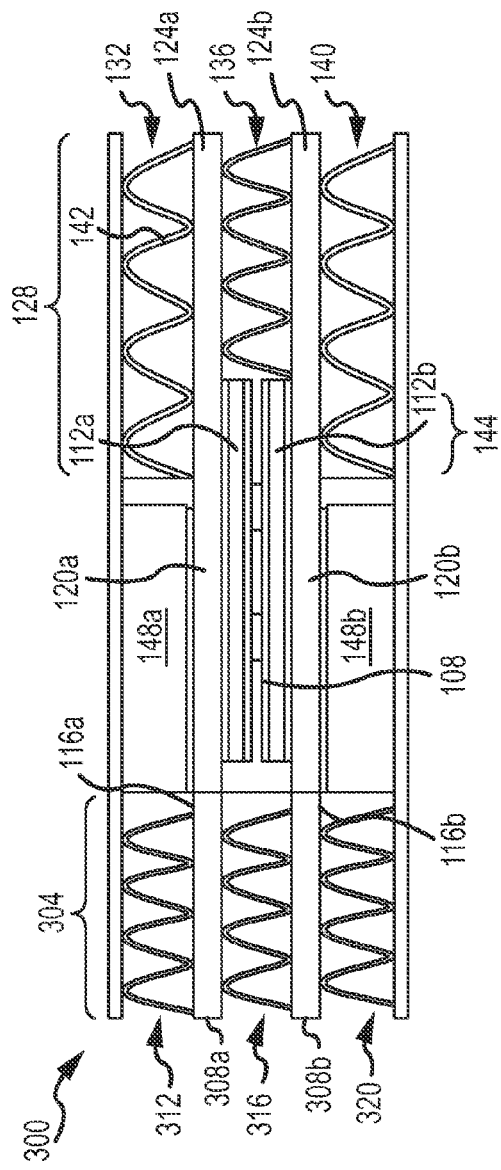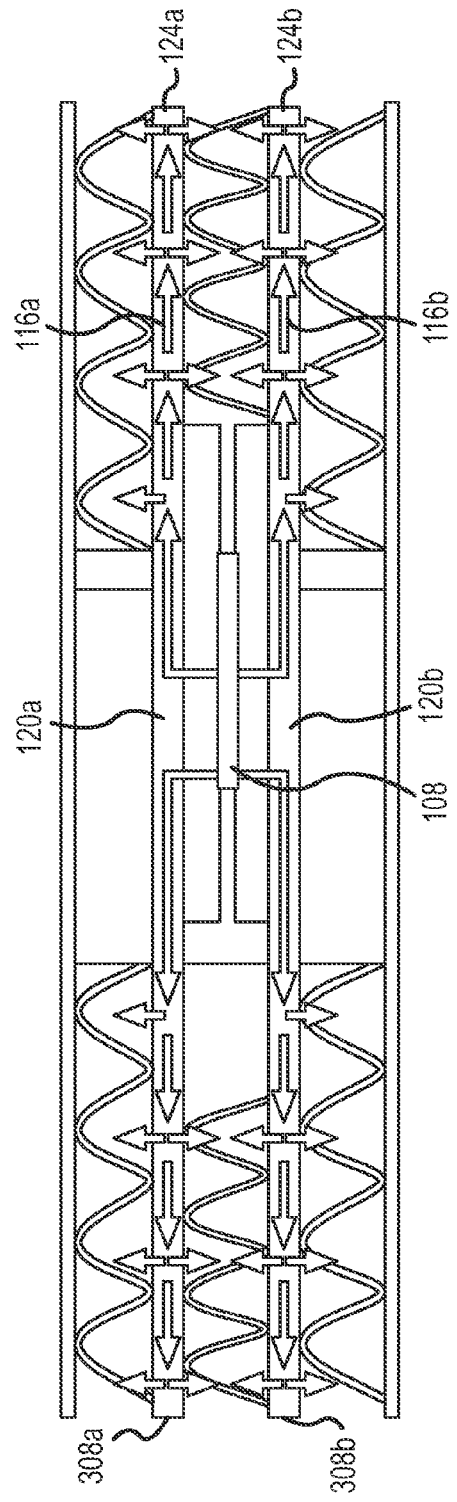

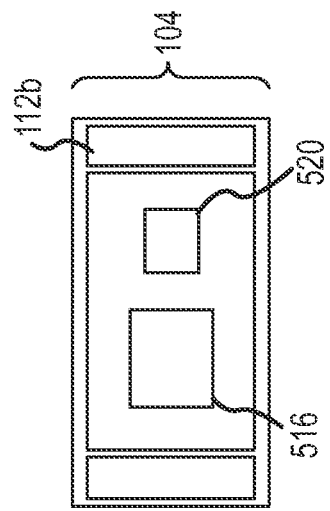
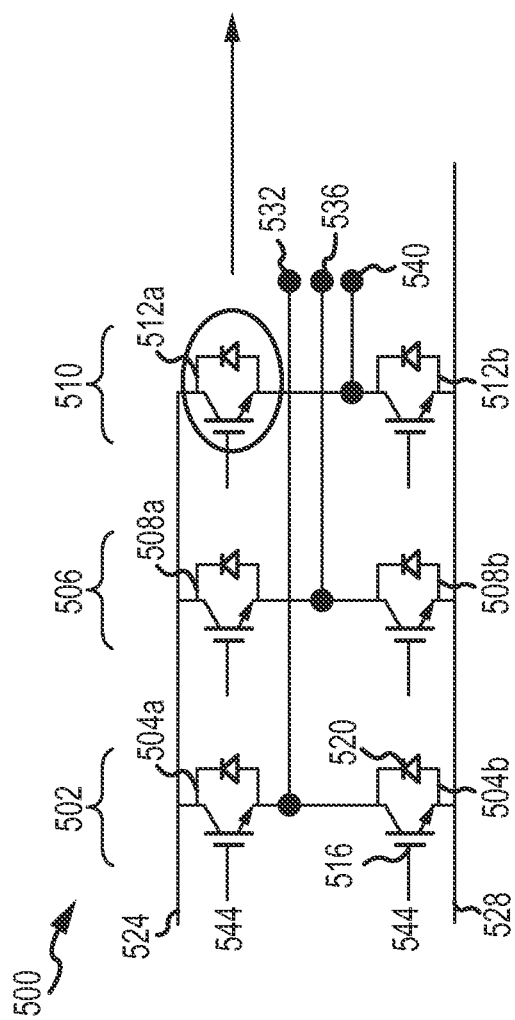

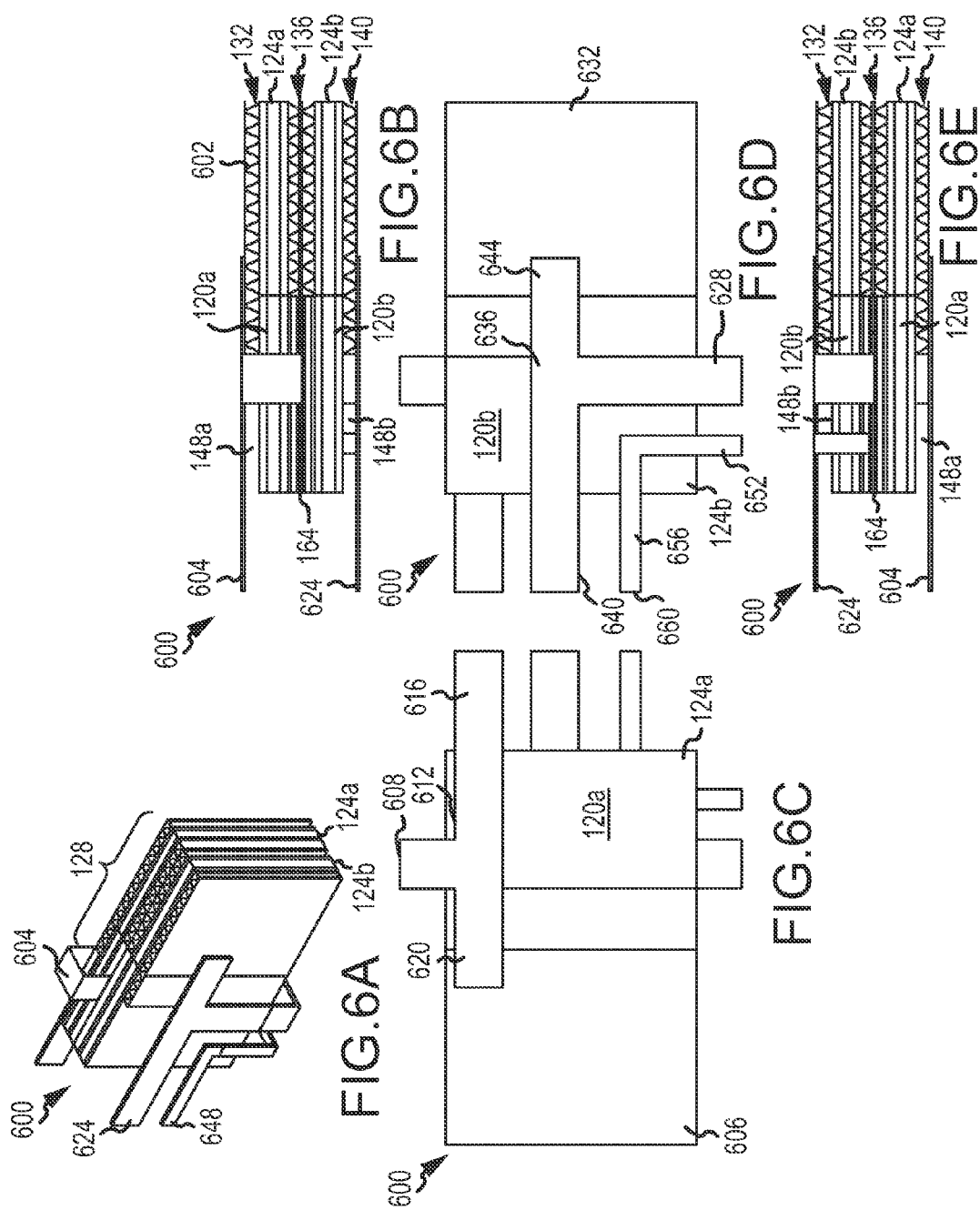

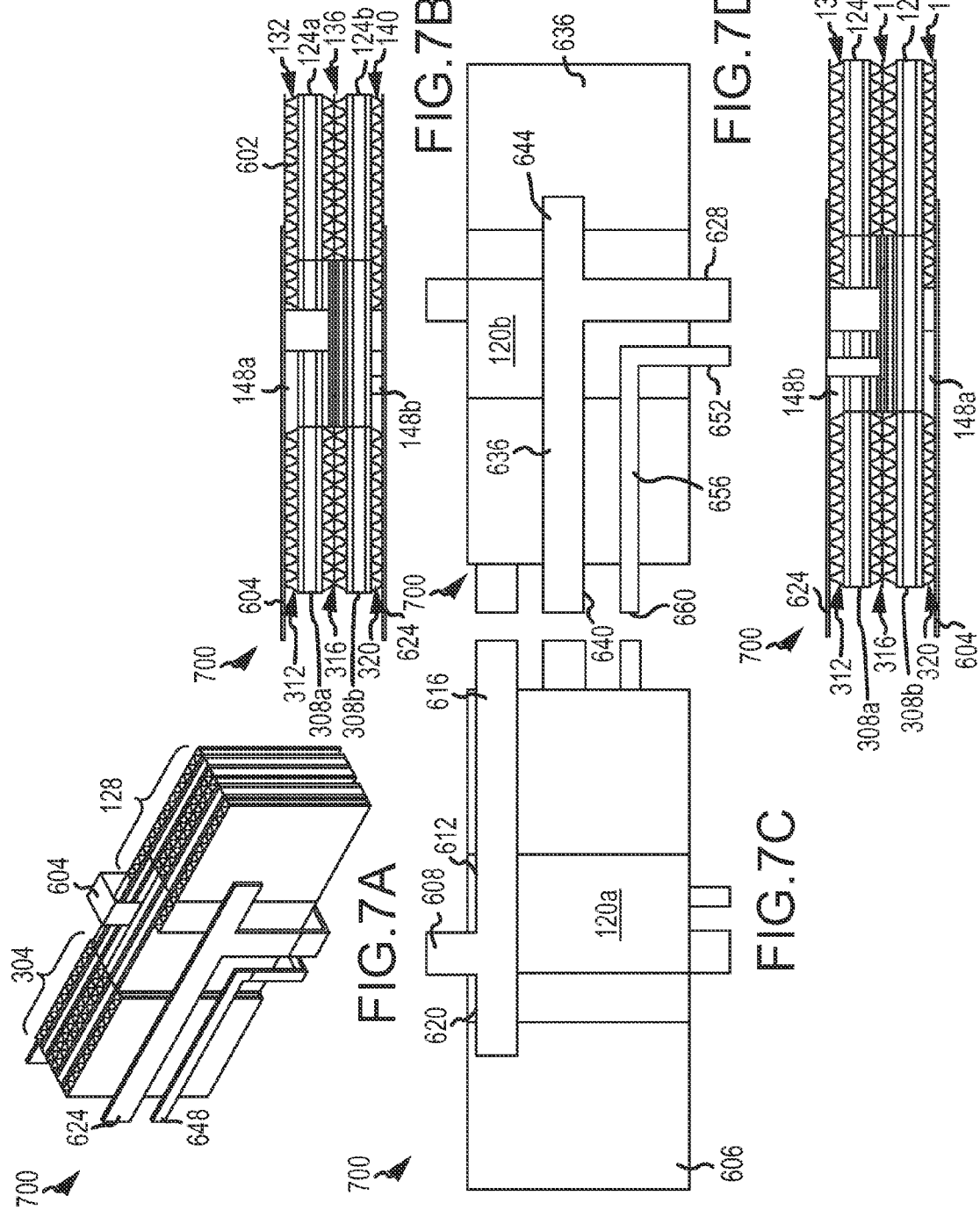

INTEGRATED THREE-DIMENSIONAL MODULE HEAT EXCHANGER FOR POWER ELECTRONICS COOLING

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

Electric drive systems, which include electric machines and power electronics, are an important enabling technology for advanced vehicle propulsion systems that reduce the U.S. transportation sector's dependence on petroleum. For electric drive systems to penetrate the automotive market, however, it is important for electric machines and power electronics to enable vehicle solutions that are economically viable. A significant element in the operation of electric drive systems are power electronics and power semiconductor packages. Improving thermal management of power electronics can help reduce the cost, weight, and volume of electric drive systems and thus increase market acceptance.

The foregoing examples of the related art and limitations related therewith are intended to be illustrative and not exclusive. Other limitations of the related art will become apparent to those of skill in the art upon a reading of the specification and a study of the drawings.

SUMMARY

Embodiments discussed herein are directed to a power semiconductor packaging that removes heat from a semiconductor package through one or more cooling zones that are located in a laterally adjacent position with respect to the semiconductor package. Also discussed are circuit element embodiments that are constructed from one or more modular power semiconductor packages. The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In various aspects, the present disclosure relates to a circuit element, comprising: a semiconductor package having opposing first and second, sides; a heat exchanger plate having opposing first and second sides, the first side of the semiconductor package connected to the first side of the heat exchanger plate at a base of the heat exchanger plate, the heat exchanger plate having a wing not connected to the semiconductor package, the wing integrally formed with the base of the heat exchanger plate and extending from the base beyond a first edge of the semiconductor package; the base of the heat exchanger plate in thermal communication with the semiconductor package such that heat generated in the semiconductor package flows out through the first side of the semiconductor package into the base of the heat exchanger plate; the wing of the heat exchanger plate in thermal communication with the base of the heat exchanger plate such that heat in the base flows into the wing; and a cooling element connected to the first side of the heat exchanger plate at the wing of the heat exchanger plate, the cooling element in thermal communication with the wing of the heat exchanger plate such that heat in the wing flows into the cooling element.

In some embodiments, the heat exchanger plate is a first heat exchanger plate, the circuit element further comprising: a second heat exchanger plate having opposing first and second sides, the second side of the semiconductor package connected to the second heat exchanger plate at a base of the second heat exchanger plate, the second heat exchanger plate having a wing not connected to the semiconductor package, the wing integrally formed with the base of the second heat exchanger plate and extending from the base beyond the first edge of the semiconductor package; wherein the base of the second heat exchanger plate is in thermal communication with the semiconductor package such that heat generated in the semiconductor package flows out through the second side of the semiconductor package into the base of the second heat exchanger plate; the wing of the second heat exchanger plate is in thermal communication with the base of the second heat exchanger plate such that heat in the base flows into the wing; and the cooling element is additionally connected to the first side of the second heat exchanger plate at the wing of the second heat exchanger plate, the cooling element in thermal communication with the wing of the second heat exchanger plate such that heat in the wing of the second heat exchanger plate flows into the cooling element.

In some embodiments, the cooling element is a first cooling element, the circuit element further comprising: a second cooling element connected to the second side of the first heat exchanger plate at the wing of the first heat exchanger plate, the second cooling element in thermal communication with the wing of the first heat exchanger plate such that heat in the wing of the first heat exchanger plate flows into the second cooling element; and a third cooling element connected to the second side of the second heat exchanger plate at the wing of the second heat exchanger plate, the second cooling element in thermal communication with the wing of the second heat exchanger plate such that heat in the wing of the second heat exchanger plate flows into the third cooling element.

In some embodiments, the second cooling element is additionally connected to the second side of the first heat exchanger plate at a portion of the base of the first heat exchanger plate, the second cooling element in thermal communication with the base of the first heat exchanger plate such that heat in the base of the first heat exchanger plate flows into the second cooling element; and the third cooling element is additionally connected to the second side of the second heat exchanger plate at a portion of the base of the second heat exchanger plate, the second cooling element in thermal communication with the base of the second heat exchanger plate such that heat in the base of the second heat exchanger plate flows into the third cooling element.

In some embodiments, the wing of the first heat exchanger plate is a first wing of the first heat exchanger plate, and the wing of the second heat exchanger plate is a first wing of the second heat exchanger plate, the circuit element further comprising: a second wing of the first heat exchanger plate not connected to the semiconductor package, the second wing integrally formed with the base of the first heat exchanger plate and extending from the base beyond a second edge of the semiconductor package, the second wing of the first heat exchanger plate in thermal communication with the base of the first heat exchanger plate such that heat in the base flows into the second wing; a second wing of the second heat exchanger plate not connected to the semiconductor package, the second wing integrally formed with the base of the second heat exchanger plate and extending from the base beyond the second edge of the semiconductor package, the second wing of the second heat exchanger plate in thermal communication with the base of the second heat exchanger plate such that heat in the base flows into the second wing; and a fourth cooling element connected to the first side of the first heat exchanger plate at the second wing of the first heat exchanger plate, the fourth cooling element additionally connected to the first side of the second heat exchanger plate at the second wing of the second heat exchanger plate, the fourth cooling element in thermal communication with the second wings of the first and second heat exchanger plates such that heat in the second wings of the first and second heat exchanger plates flows into the fourth cooling element.

In some embodiments, the circuit element further comprises: a fifth cooling element connected to the second side of the first heat exchanger plate at the second wing of the first heat exchanger plate, the fifth cooling element in thermal communication with the second wing of the first heat exchanger plate such that heat in the second wing of the first heat exchanger plate flows into the fifth cooling element; and a sixth cooling element connected to the second side of the second heat exchanger plate at the second wing of the second heat exchanger plate, the sixth cooling element in thermal communication with the second wing of the second heat exchanger plate such that heat in the second wing of the second heat exchanger plate flows into the sixth cooling element.

In some embodiments, the cooling element comprises: a flow passage configured to receive a flow of coolant there through; and one or more heat transfer surfaces within the flow passage.

In various aspects, the present disclosure relates to a method of cooling a power electronics switch in an electric vehicle, comprising: generating heat in a semiconductor portion of a power electronics switch by passage of current through the switch between a first electric subsystem and a second electric subsystem of an electric vehicle; removing heat from the semiconductor by passage of heat through a surface of the semiconductor into a base of a heat exchanger plate; removing heat from the base of the heat exchanger plate by passage of heat along a length of the heat exchanger plate into a wing of the heat exchanger plate; and removing heat from the wing of the heat exchanger plate by passage of heat through first and second opposing surfaces of the wing of the heat exchanger plate.

In various aspects, the present disclosure relates to a circuit element, comprising: a semiconductor package having opposing first and second sides; a heat exchanger plate connected to the first side of the semiconductor package at a base of the heat exchanger plate, the base of the heat exchanger plate in thermal communication with the semiconductor package such that heat generated in the semiconductor package flows out through the first side of the semiconductor package into the base of the heat exchanger plate; the heat exchanger plate having a first wing not connected to the semiconductor package, the first wing integrally formed with the base of the heat exchanger plate and extending from the base beyond a first edge of the semiconductor package, the first wing of the heat exchanger plate in thermal communication with the base of the heat exchanger plate such that heat in the base flows into the first wing; the heat exchanger plate having a second wing not connected to the semiconductor package, the first wing integrally formed with the base of the heat exchanger plate and extending from the base beyond a second edge of the semiconductor package, the second wing of the heat exchanger plate in thermal communication with the base of the heat exchanger plate such that heat in the base flows into the second wing; a first cooling element connected to the first heat exchanger plate at the first wing of the heat exchanger plate, the first cooling element in thermal communication with the first wing of the heat exchanger plate such that heat in the first wing flows into the first cooling element; and a second cooling element connected to the heat exchanger plate at the second wing of the heat exchanger plate, the second cooling element in thermal communication with the second wing of the heat exchanger plate such that heat in the second wing flows into the second cooling element.

In some embodiments, the first cooling element includes a flow passageway that is configured to receive a flow of liquid coolant there through; and the second cooling element includes a flow passageway that is configured to receive a flow of gaseous coolant there through.

In some embodiments, the heat exchanger plate has opposing first and second sides; the first cooling element is connected to the first side of the first heat exchanger plate at the first wing of the heat exchanger plate, and the second cooling element connected to the first side of the first heat exchanger plate at the second wing of the heat exchanger plate.

In some embodiments, the heat exchanger plate is a first heat exchanger plate, the circuit element further comprising: a second heat exchanger plate connected to the second side of the semiconductor package at a base of the second heat exchanger plate, the base of the second heat exchanger plate in thermal communication with the semiconductor package such that heat generated in the semiconductor package flows out through the second side of the semiconductor package into the base of the second heat exchanger plate; the second heat exchanger plate having a first wing not connected to the semiconductor package, the first wing integrally formed with the base of the second heat exchanger plate and extending from the base beyond the first edge of the semiconductor package, the first wing of the second heat exchanger plate in thermal communication with the base of the heat exchanger plate such that heat in the base flows into the first wing; and the second heat exchanger plate having a second wing not connected to the semiconductor package, the second wing integrally formed with the base of the second heat exchanger plate and extending from the base beyond the second edge of the semiconductor package, the second wing of the second heat exchanger plate in thermal communication with the base of the heat exchanger plate such that heat in the base flows into the second wing; wherein the first cooling element is connected to the second heat exchanger plate at the first wing of the second heat exchanger plate, the first cooling element in thermal communication with the first wing of the second heat exchanger plate such that heat in the first wing flows into the first cooling element; and the second cooling is element connected to the second heat exchanger plate at the second wing of the second heat exchanger plate, the second cooling element in thermal communication with the second wing of the second heat exchanger plate such that heat in the second wing flows into the second cooling element.

In various aspects, the present disclosure relates to a method of cooling a power electronic switch in a electric vehicle, comprising: driving a first current through a power electronics switch; removing heat generated in the power electronics switch by the first current by passing a first coolant fluid through a first cooling element; driving a second current through the power electronics switch; removing heat generated in the power electronics switch by the second current by passing the first coolant fluid through the first cooling element and by passing a second coolant fluid through a second cooling element.

In some embodiments, the first current is generated by charging a battery of the electric vehicle; the first coolant fluid is air provided by a fan of the electric vehicle or natural convection; the second current is generated by operating an electric motor of the electric vehicle, and the second coolant fluid is liquid or air provided by a vehicle cooling system.

In various aspects, a circuit element, comprising: a first module comprising a semiconductor package and a heat exchanger plate connected to the semiconductor package at a base of the heat exchanger plate, the heat exchanger plate having a wing not connected to the semiconductor package, the wing integrally formed with the base of the heat exchanger plate and extending from the base beyond a first edge of the semiconductor package; a second module comprising a semiconductor package and a heat exchanger plate connected to the semiconductor package at a base of the heat exchanger plate, the heat exchanger plate having a wing not connected to the semiconductor package, the wing integrally formed with the base of the heat exchanger plate and extending from the base beyond a first edge of the semiconductor package; and a cooling element connected to the first and second modules in a stacked arrangement such that the wing of the heat exchanger plate of the first module is connected to a first side of the cooling element, and a second side of the cooling element is connected to the wing of heat exchanger plate of the second module; wherein the cooling element is not connected to a least a portion of the base of the heat exchanger plate of the first module and not connected to at least a portion of the base of the heat exchanger plate of the second module such that a void space exists adjacent the cooling element and between the bases of the heat exchanger plates of the first and second modules.

In some embodiments, the circuit element further comprises: a thermal insulating layer disposed between the void space and the base of the heat exchanger plate of the first module.

In some embodiments, the first module includes a bus bar comprising: a u-shaped portion connected to a second edge of the semiconductor package of the first module, the first and second edges of the semiconductor package of the first module being perpendicular, the u-shape portion extending from the second edge of the semiconductor package of the first module into the void space between the bases of the heat exchanger plates of the first and second modules; and a transverse portion integrally formed with the u-shaped portion, the transverse portion extending from within the void space beyond a third edge of the semiconductor package of the first module, the first and third edges of the semiconductor package of the first module being parallel.

In some embodiments, the cooling element comprises a first cooling element connected to the heat exchanger plate of the first module; and a second cooling element connected to the heat exchanger plate of the second module; wherein the transverse portion of the bus bar extends from within the void space into a space between the first and second cooling elements.

In some embodiments, the semiconductor package of the second module has second and third sides, the first and third sides of the semiconductor package of the second module being parallel, the cooling element is a first cooling element, the circuit element further comprising: second and third cooling elements connected to the first and second modules in a stacked arrangement; wherein the wing of the heat exchanger plate of the first module is a first wing, the heat exchanger plate of the first module having a second wing integrally formed with the base of the heat exchanger plate and extending from the base beyond the third edge of the semiconductor package of the first module; the wing of the heat exchanger plate of the second module is a first wing, the heat exchanger plate of the second module having a second wing integrally formed with the base of the heat exchanger plate and extending from the base beyond the third edge of the semiconductor package of the second module; the second wing of the heat exchanger plate of the first module is connected to the second cooling element; the second wing of the heat exchanger plate of the second module is connected to the third cooling element; and the transverse portion of the bus bar extends from within the void space through a space between the second and third cooling elements.

In some embodiments, the first module includes an additional bus bar comprising: a u-shaped portion connected to a fourth edge of the semiconductor package of the first module, the second and fourth edges of the semiconductor package of the first module being perpendicular, the u-shape portion extending from the fourth edge of the semiconductor package of the first module into an additional void space adjacent a side of the semiconductor package opposite from that of the void space; and a transverse portion integrally formed with the u-shaped portion, the transverse portion extending from within the additional void space beyond the third edge of the semiconductor package of the first module.

In some embodiments, the first module is a power electronics switch, the semiconductor package of the first module including an insulated gate bipolar junction transistor connected in parallel with a diode; the bus bar connected to an emitter of the transistor; and the additional bus bar connected to a collector of the transistor.

In some embodiments, the second module is a second power electronics switch, the semiconductor package of the second module including an insulated gate bipolar junction transistor connected in parallel with a diode, the second module having a bus bar connected to an emitter of the transistor, the second module having an additional bus bar connected to a collector of the transistor; the first and second modules together forming a half-bridge component of a three-phase inverter, the three-phase inverter configured to connect direct current and alternating current subsystems of an electric vehicle; the additional bus bar of the first module providing a first connection to the direct current subsystem; the bus bar of the second module providing a second connection to the direct current subsystem; the bus bar of the first module and the additional bus bar of the second module providing one phase of a three-phase connection to the alternating current subsystem.

In some embodiments, the additional bus bar of second module comprises a u-shaped portion connected to a second edge of the semiconductor package of the second module, the first and second edges of the semiconductor package of the second module being perpendicular, the u-shape portion extending from the second edge of the semiconductor package of the second module into the void space between the bases of the heat exchanger plates of the first and second modules; the additional bus bar of the second module further comprising a transverse portion integrally formed with the u-shaped portion, the transverse portion extending from within the void space beyond a third edge of the semiconductor package of the second module, the first and third edges of the semiconductor package of the second module being parallel; the bus bar of the second module comprises a u-shaped portion connected to a fourth edge of the semiconductor package of the second module, the second and fourth edges of the semiconductor package of the second module being perpendicular, the u-shaped portion extending from the fourth edge of the semiconductor package of the second module into an additional void space adjacent a side of the semiconductor package opposite from that of the void space; the bus bar of the second module further comprising a transverse portion integrally formed with the u-shaped portion, the transverse portion extending from within the additional void space beyond the third edge of the semiconductor package of the first module; and the transverse portion of the bus bar of the first module and the transverse portion of additional bus bar of the second module being parallel to each other within the void space.

In some embodiments, the first module includes a control signal bus bar; the second module includes a control signal bus bar; the control signal bus bars of the first and second modules carry a control signal from a control system component of the electric vehicle; when the control system component asserts the control signal, current is allowed to flow from the direct current subsystem to the alternating current subsystem through the transistors of the first and second modules; and when the control system component de-asserts the control signal, current is allowed to flow from the alternating current subsystem to the direct current subsystem through the diodes of the first and second modules.

In various aspects, the control signal bus bar of the first module comprises a u-shaped portion connected to the second edge of the semiconductor package of the first module, the u-shaped portion extending from the second edge of the semiconductor package of the first module into the void space between the bases of the heat exchanger plates of the first and second modules; the control signal bus bar of the first module further comprising a transverse portion integrally formed with the u-shaped portion, the transverse portion extending from within the void space beyond the third edge of the semiconductor package of the first module; and the transverse portion of the bus bar of the first module and the transverse portion of control signal bus bar of the first module being parallel to each other within the void space.

BRIEF DESCRIPTION OF THE DRAWINGS

Those skilled in the art will understand that the drawings, described herein, are for illustration purposes only. The drawings are not intended to limit the scope of the present disclosure.

FIG. 3 is a schematic illustration of an embodiment of a circuit element having first and second lateral cooling zones;

FIG. 4 is a schematic illustration of a pattern of heat flow in the circuit element shown in FIG. 3;

FIG. 5A is a circuit diagram for a voltage source three-phase inverter;

FIG. 5B is an illustration of a semiconductor package that implements one of the switching elements of the inverter shown in FIG. 5A;

FIG. 6A is an isometric view of a circuit element as shown in FIG. 1 that additionally includes a number of bus bars;

FIG. 6B is a top view of the circuit element shown in FIG. 6A;

FIG. 6C is a back view of the circuit element shown in FIG. 6A;

FIG. 6D is a front view of the circuit element shown in FIG. 6A;

FIG. 6E is a bottom view of the circuit element shown in FIG. 6A;

FIG. 7A is an isometric view of a circuit element as shown in FIG. 3 that additionally includes a number of bus bars;

FIG. 7B is a top view of the circuit element shown in FIG. 7A;

FIG. 7C is a back view of the circuit element shown in FIG. 7A;

FIG. 7D is a front view of the circuit element shown in FIG. 7A;

FIG. 7E is a bottom view of the circuit element shown in FIG. 7A;

DETAILED DESCRIPTION

Reference is now made in detail to certain embodiments directed to a power semiconductor packaging that removes heat from a semiconductor package through one or more cooling zones that are located in a laterally oriented position with respect to the semiconductor package. Also discussed are circuit element embodiments that are constructed from one or more modular power semiconductor packages. The disclosed embodiments are not intended to be limiting of the claims. To the contrary, the claims are intended to cover all alternatives, modifications, and equivalents.

Embodiments discussed herein are directed to power semiconductor packaging that provides for electrical connections while at the same time enabling heat removal from the semiconductor device. The power semiconductor packaging discussed herein may used in semiconductor devices that implement switching elements used in electric vehicles. For example, vehicles with electric drive systems may have one or more inverters in the vehicle for controlling the electric traction drive motor. A typical voltage source three-phase inverter used in automotive applications consists of six switching elements. In one embodiment, a power semiconductor packaging as discussed herein may be used to package each of the switching elements in such an inverter.

It should be appreciated that the power semiconductor packaging discussed herein is not limited to use in electric vehicles. Rather, the power semiconductor packaging discussed herein may be used in any electrified vehicle including, for example, a hybrid electric vehicle (HEV), a plug-in hybrid electric vehicle (PREV), an electric vehicle (EV), a fuel cell vehicle (FCV), and so on. The power semiconductor packaging discussed herein may be used in other automotive applications including, for example, DC-DC converters. Embodiments discussed herein may be used outside of automotive applications including, for example, variable speed motor drives for energy efficiency, solar power and microscale grid power electronics, wind power generation power electronics.

Power Semiconductor Package with a Lateral Cooling Zone

Figure 1:
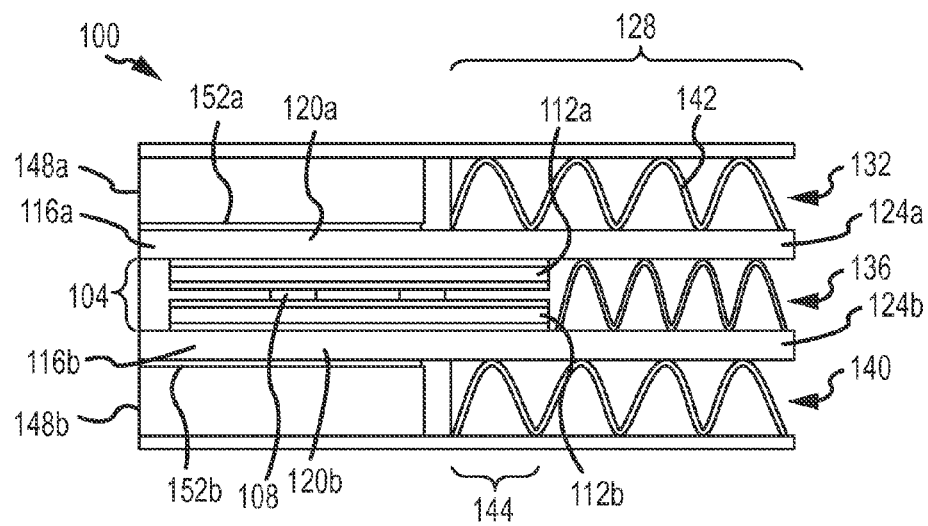
FIG. 1 is a schematic illustration of an embodiment of a circuit element having a lateral cooling zone.

FIG. 1 is a schematic illustration of circuit element generally identified by reference numeral 100. The circuit element 100 includes a planar semiconductor package 104 having one or more semiconductor devices 108 formed on a substrate. In a power electronics application, the semiconductor devices 108 may include insulated gate bipolar transistors (IGBTs) and diodes. When implemented as silicon devices, IGBTs and diodes typically operate below fixed temperature limits of 125° C. to 150° C. to ensure a safe and reliable performance. However, higher temperatures may be possible with advances in silicon carbide (SiC) or gallium nitride (GaN). In one aspect, the power semiconductor packaging discussed herein enables an electric vehicle power electronics to operate within this thermal limitation while at the same time meeting performance requirements for system reliability, cost, volume, and weight.

In one aspect, the power semiconductor packaging discussed herein achieves advantages by cooling the semiconductor devices 108 through both the top and bottom sides of the semiconductor package 104. In this regard, the semiconductor devices 108 shown in FIG. 1 may be attached at one side to a first substrate 112a and attached at an opposing side to a second substrate 112b. Heat may be removed from the semiconductor package 104 through first and second heat exchanger plates 116a,b. A first side of the first heat exchanger plate 116a is connected to the first substrate 112a. Similarly, a first side of the second heat exchanger plate 116b is connected to the second substrate 112b. While a planar package is shown FIG. 1 by of illustration, embodiments may be configured to work with different commercially available packages, including single sided packages. In single sided packages, power semiconductor packaging discussed herein provides cooling through one side of the underlying semiconductor package.

The first heat exchanger plate 116a includes a first portion that is connected to the semiconductor package 104 at the first substrate 112a and a second portion that extends laterally outward from the semiconductor package 104. As used herein, the first portion of the first heat exchanger plate 116a that attaches to the semiconductor package 104 is referred to as the "base" 120a of the first heat exchanger plate 116a. Additionally, the second portion of the first heat exchanger plate 116a that extends laterally outward from the semiconductor package 104 is referred to as a "wing" 124a of the first heat exchanger plate 116a. The second heat exchanger plate 116b is connected to the second substrate 112b at a base 120b of the second heat exchanger plate 116b. The second heat exchanger plate 116b also includes a wing 124b that extends laterally outward from the base 120b of the second heat exchanger plate 116b.

Generally, the base 120a and the wing 124a are integrally formed with each other such that these components are two portions of the same continuous plate: the first heat exchanger plate 116a. Similarly, the base 120b and the wing 124b are generally integrally formed with each other such that these components are two portions of the same continuous plate: the second heat exchanger plate 116b. However, in some embodiments, the bases 120a,b and the wings 124a,b may be separate parts that attach to form the first and second heat exchanger plates 116a,b. Multiple configurations for the first and second heat exchanger plates 116a,b are possible, such as, a single material, composite structure, heat pipe, or vapor chamber.

The wings 124a,b of the first and second heat exchanger plates 116a,b establish a lateral cooling zone 128. The lateral cooling zone 128 includes a top cooling area 132 adjacent the second side of the first heat exchanger plate 116a; a middle cooling area 136 between the first sides of the first and second heat exchanger plates 116a,b; and a bottom cooling area 140 adjacent the second side of the second heat exchanger plate 116b. The middle cooling area 140 is defined by an edge of the semiconductor package 104 and the wings 124a,b of the first and second heat exchanger plates 116a,b. The top cooling area 132 is defined on one side by the wing 124a of the first heat exchanger plate 116a. The bottom cooling area 140 is defined on one side by the wing 124b of the second heat exchanger plate 116b. The lateral cooling zone 128 provides for heat transfer from the bottom, top, and sides of the semiconductor package 104. Specifically, as explained in greater detail below, the lateral cooling zone 128 provides for movement of heat along the lengths of the first and second heat exchanger plates 116a,b to adjacent points where heat may be transferred from opposing sides of the first and second heat exchanger plates 116a,b.

The circuit element 100 may include one or more heat exchangers located in the top 132, middle 136, or bottom 140 cooling areas. In some embodiments, heat exchangers or other cooling elements used in the circuit element 100 have a fluid passageway through which a coolant fluid may pass in order to remove heat from a surface of a heat exchanger plate. With reference to FIG. 1, the fluid passageway and the flow of fluid there through are substantially normal to the page. The coolant can be any heat transfer fluid suitable for use in a vehicle such as, for example, air, water, deionized water, ethylene glycol, poly(ethylene glycol), diethylene glycol, propylene glycol, betaine, polyalkylene glycols, copper oxide nanofluids, alumina nanofluids, titanium dioxide nanofluids, silica nanofluids, carbon nanofluids, and combinations thereof. In certain embodiments, a mixture of water and ethylene glycol and/or poly(ethylene glycol) may circulate through a heat exchanger. Some embodiments may implement an air-cooled system that passes a flow of air through a heat exchanger or other cooling element in order to remove heat from a heat exchanger plate.

In order to provide for more efficient cooling, a heat exchanger used for cooling purposes may include one or more cooling fins 142 or other heat transfers surfaces. For example, the circuit element 100 shown in FIG. 1 includes a number of cooling fins 142 disposed within the top cooling area 132, the middle cooling 136, and the bottom cooling area 140. A cooling element 100 may incorporate folded fin heat exchangers or compact folded fin heat exchangers, but the innovation is not limited to a specific fin or area enhancement approach. It should be appreciated that embodiments are not limited to the use of fins as a heat transfer surface. Some embodiments may use heat transfer surfaces such as pin fins, coatings, or other structures to aid heat transfer. Although not shown in FIG. 1, some embodiments may include tip fins disposed on the tips or ends of the heat exchanger plates 116a,b. Depending on the thickness of the heat spreader, surface enhancements for cooling could also be applied to the ends or tips of the heat exchanger plates 116a,b. The heat exchanger plates 116a,b and fins 142 could also be expanded in the direction normal to the page to provide additional cooling surface area.

In one embodiment, the top cooling area 132 overlaps with the base 120a of the first heat exchanger plate 116a, and the bottom cooling area 140 overlaps with the base 120b of the second heat exchanger plate 116b. In this embodiment, the cooling element 100 includes an overlap area 144 inside which the top cooling area 132 contacts a portion of the base 120a of the first heat exchanger plate 116a, and the bottom cooling area 140 contacts a portion of the base 120b of the second heat exchanger plate 116b. Here, the top cooling area 132 and the bottom cooling area 140 provide for direct cooling of at least a portion of the semiconductor package 104. Specifically, at least some heat may be transferred out of the first and second heat exchanger plates 116a,b without the heat moving along the lengths of the first and second heat exchanger plates 116a,b to points that are laterally adjacent to the semiconductor package 104.

The circuit element 100 may include a first void space 148a that is adjacent to the base 120a of the first heat exchanger plate 116a. The circuit element 100 may also include a second void space 148b that is adjacent the base 120b of the second heat exchanger plate 116b. In one embodiment, the first void space 148a is adjacent the entirety of the base 120a of the first heat exchanger plate 116a, and the second void space 148b is adjacent the entirety of the base 120b of the second heat exchanger plate 116b. In an embodiment having an overlap area 144, the first void space 148a is adjacent to only a portion of the base 120a of the first heat exchanger plate 116a, and the second void space 148b is adjacent to only a portion of the base 120b of the second heat exchanger plate 116b. As explained in greater detail below, the void spaces 148a,b provide an area for the placement of additional circuit components or for the routing of bus bars that provide electrical connections to the semiconductor devices 108 within the semiconductor package 104.

The circuit element 100 may include a thermal insulator 152a between the first void space 148a and the base 120a of the first heat exchanger plate 116a. The circuit element 100 may also include a thermal insulator 152b between the second void space 148b and the base 120b of the second heat exchanger plate 116b. The thermal insulators 152a,b prevent or reduce heat transfer from the heat exchanger plates 116a,b into the void spaces 148a,b. In this way, additional circuit components or bus bars that are located in the void spaces 148a,b are shielded from heat generated in the semiconductor package 104.

Figure 2:
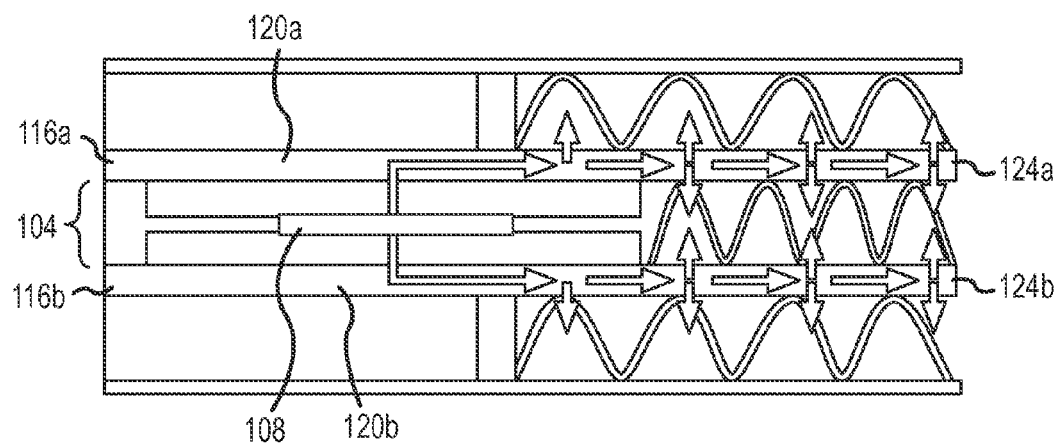
FIG. 2 is a schematic illustration of a pattern of heat flow in the circuit element shown in FIG. 1.

FIG. 2 is an illustration of heat flow out of a semi-conductor device using the semi-conductor power electronics packaging shown in FIG. 1. As shown in FIG. 2, heat flows out of the semi-conductor package 104 through the top, bottom and sides of the semiconductor 104. Specifically, heat first flows out of the semiconductor package 104 into the base 120a of the first heat exchanger plate 116a. Heat also flows out of the semiconductor package 104 into the base 120b of the second heat exchanger plate 116b. Heat in the base 120a of the first heat exchanger plate 116a flows into the wing 124a of the first heat exchanger plate 116a. Similarly, heat in the base 120b of the first heat exchanger plate 116b flows from there into the wing 124b of the second heat exchanger plate 116b. Once in the wings 124a,b of the first and second heat exchanger plates 116a,b; heat flows from there into the various cooling areas of the lateral cooling zone 128. Specifically, heat flows from the first wing 124a into the top cooling area 132 and the middle cooling area 136. Heat flows from the second wing 124b in to the middle cooling area 136 and into the bottom cooling area 140.

Power Semiconductor Package with Two Lateral Cooling Zones

FIG. 3 is a schematic illustration of a circuit element 300 having two lateral cooling zones. The circuit element 300 includes a first cooling zone that is identified by reference numeral 128. As described above in connection with FIG. 1, the first cooling zone 128 is defined by the wings 124a,b of the first and second heat exchanger plates 116a,b. The first cooling zone 128 includes top 132, middle 136, and bottom 140 cooling areas that provide for heat transfer from the bottom, top, and sides of the semiconductor package 104. In addition to the first cooling zone 128, the circuit element 300 additionally includes a second cooling zone that is identified by reference numeral 304.

The second cooling zone 304 is defined by second wings 308a,b of the first and second heat exchanger plates 116a,b. The second wing 308a of the first heat exchanger plate 116a is integrally formed with and extends outwardly from the base 120a of the first heat exchanger plate 116a. Similarly, the second wing 308b of the second heat exchanger plate 116b is integrally formed with and extends outwardly from the base 120b of the second heat exchanger plate 116b. The second cooling zone 304 includes top 312, middle 316, and bottom 320 cooling zones that provide for heat transfer from the bottom, top, and sides of the semiconductor package 104. Like the first cooling zone 128, the second cooling zone 304 provides for movement of heat along the lengths of the first and second heat exchanger plates 116a,b to adjacent points where heat may be transferred from opposing sides of the first and second heat exchanger plates 116a,b. The first 128 and second 304 cooling zones may be of equal or differing lengths or size. More particularly, the first wings 124a,b may be longer than the second wings 308a,b. Alternatively, the first wings 124a,b may have a length that is equal to or shorter than the second wings 308a,b.

Like the circuit element 100 shown in FIG. 1, the circuit element 300 may include a first void space 148a that is adjacent the base 120a of the first heat exchanger plate 116a, and a second void space 148b that is adjacent the base 120b of the second heat exchanger plate 116b. Additionally, the first void space 148a may be bounded on one side by the top cooling area 312 of the second cooling zone 304. Similarly, the second void space 148b may be bounded on one side by the bottom cooling area 320 of the second cooling zone 304. The void spaces 148a,b provide an area for the placement of additional circuit components or for the routing of bus bars that provide electrical connections to the semiconductor devices 108 within the semiconductor package 104. In order to protect components in the void spaces 148a,b from heat generated in the semiconductor package 104, the circuit element 310 may employ thermal insulating layers 152a,b.

FIG. 4 is an illustration of heat flow out of a semiconductor device using the power semiconductor packaging shown in the FIG. 3. In one respect, the semiconductor device 108 may be cooled through the first cooling zone 128, as described above in connection with FIG. 2. Additionally, the semiconductor device 108 may also be cooled through the second cooling zone 304. Specifically, heat first flows out of the semiconductor package 104 into the bases 120a,b of the first and second heat exchanger plates 116a,b. Heat in the bases 120a,b of the first and second heat exchanger plates 116a,b flows from there into the wings 308a,b of the first and second heat exchanger plate 116a,b. Once in the wings 308a,b of the first and second heat exchanger plates 116a,b, heat flows from there into the various cooling areas of the second cooling zone 304. Specifically, heat flows from the first wing 308a into the top cooling area 312 and the middle cooling area 316. Similarly, heat flows from the second wing 308b into the middle cooling area 316 and into the bottom cooling area 320.

In an electric vehicle application, the first 128 and second 304 cooling zones may be used at different points during the operation of the vehicle. For example, an electric vehicle may operate in a number of different modes, such as, a charging mode where the vehicle is stationary and the battery is charged, and a driving mode where motor is propelling the car forward. In some embodiments, certain modes of vehicle operation use one of either the first 128 or second 304 cooling zones, while other modes of vehicle operation use both the first 128 and second 304 cooling zones. In one embodiment, the first cooling zone 128 may be an air cooled system and the second cooling zone 304 may a liquid cooled system. It should be appreciated that this configuration is discussed by way of example and not limitation and that any combination cooling fluids is within the scope of certain embodiments: air-liquid, liquid-air, air-air, liquid-liquid, and so on. In charging mode, when less heat is generated, the vehicle may use the first cooling zone 128 only. Because the liquid cooled system is not used in charging mode, the vehicle may charge its battery without the need to engage the vehicle's liquid cooling system and radiator fans. In driving mode, when a greater amount of heat is generated, the vehicle may use both the first 128 and second 304 cooling zones.

Generally, an electric vehicle may be operated in accordance with embodiments discussed herein by driving a first current through a power electronics switch and removing heat generated in the power electronics switch by the first current by passing a first coolant fluid through a first cooling element. Following this, the electric vehicle may be operated by driving a second current through the power electronics switch and removing heat generated in the power electronics switch by the second current by passing the first coolant fluid through the first cooling element and by passing a second coolant fluid through a second cooling element. In one embodiment, the first current charges the vehicles battery and the first cooling zone is air cooled. Further, the second current may arise from driving the vehicle and the second cooling zone may be liquid cooled.

Bus Bar Routing in a Power Semiconductor Package Having One or More Lateral Cooling Zones The circuit element 100 includes void spaces 148a,b that may be used to provide an area for the placement of additional circuit components. The void spaces 148a,b allow for integration of electrical components such as gate drivers, control electronics, and distributed capacitors within the circuit element 100. In one embodiment, one or more bus bars may be routed through one or both of the void spaces 148a,b. The bus bars may be used to provide external electrical connections to the semiconductor devices 108 within the semiconductor package 104. The following discues an example bus bar routing for a circuit element 100 that implements a power electronic switch component of a three-phase inverter.

FIG. 5A is a circuit diagram for a three-phase inverter used in an electric car application. While certain embodiments are discussed herein with reference to the circuit topology shown in FIG. 5A, it should be appreciated that the power semiconductor packaging discussed herein may also be used with other power converter topologies. The three-phase inverter is generally identified with reference 500. The inverter 500 includes a first stage 502 composed of first and second switches 504a,b; a second stage 506 composed of first and second switches 508a,b; and a third stage 510 composed of first and second switches 512a,b. Each switch in the inverter 500 includes an insulated gate bipolar junction transistor (IGBT) 516. The transistor 516 is connected in parallel with a diode 520. In the first stage 502, the first switch 504a is connected in series to the second switch 504b such that the emitter of the first switch 504a is connected to the collector of the second switch 504b. Similarly, the second stage 506 and the third stage 510 also implement a series connection between switches. The three stages of the inverter 500 are connected to each other such that a first voltage rail 524 connects the collectors of the first switches 504a, 508a, and 512a. Further, a second voltage rail 528 connects the emitters of the second switches 504a, 508b, and 512b.

When implemented in an electric vehicle, a three stage inverter 500 may provide a connection between a first electrical subsystem of the electric vehicle and a second electrical subsystem of the electric vehicle. In one embodiment, the first electrical subsystem is an alternating current (AC) portion of the electric vehicle and the second electrical subsystem is a direct current (DC) portion of the electric vehicle. Embodiments discussed herein are also compatible with DC-DC converters or other power electronics systems used for power management and power conversion. In an implementation where the inverter 100 provides a connection between AC and DC portions of the electric vehicle, the voltage rails 524 and 528 may provide a connection from the inverter 500 to the direct current portion of the electric vehicle system. The alternating current portion of the electric vehicle may connect to the inverter 500 through a three-phase connection that includes a first connection 532 to the junction between the first and second switches 504a,b of the first stage 502, a second connection 536 to the junction between the first and second switches 508a,b of the second stage 506, and a third connection 540 to the junction between the first and second switches 512a,b of the third stage 510.

Each transistor 516 in the inverter 500 may include a control input 544 connected to the gate portion of the transistor 516. When implemented in an electric vehicle, the control input 544 may carry a control signal from a control system portion of the electric vehicle. The control signal provides a mechanism for controlling which direction current is allowed to flow through the three-phase inverter 500. With the control input 544 asserted, current is allowed to flow through the transistor 516 from the collector to the emitter. Accordingly, with an asserted control signal, current may flow from the direct current portion of the electric vehicle through the transistor 516 to the alternating current portion of the vehicle. With the control input 544 de-asserted, current is prevented from flowing through the transistors 516. In this state, current may flow from the alternating current portion of the electric vehicle through the diode 520 and into the direct current portion of the electric vehicle.

Power semiconductor packaging in accordance with embodiments discussed herein may be used to package the circuit switches used in the three-phase inverter shown in FIG. 5A. FIG. 5B is a schematic illustration of a silicon implementation of an example circuit switch 512a used in the three-phase inverter 500 shown in FIG. 5A. The circuit switch 512a shown in FIG. 5B includes a transistor 516 connected to a diode 520. While certain embodiments are discussed herein with reference to the silicon IGBT transistor and diode shown in FIG. 5B, it should be appreciated that the power semiconductor packaging discussed herein may also be used with other semiconductor devices as well. The semi-conductor packaging illustrated in FIG. 1 or FIG. 3 may be used to package the circuit switch 512a shown in FIG. 5B. In FIG. 5B, the circuit switch 512a is shown for purposes of illustration as being connected to a first substrate 112b so that the transistor 516 and the diode 520 are visible. However, it should be appreciated that the visible portions of the transistor 516 and the diode 520 may connect to a second substrate not shown in FIG. 5B. This double sided substrate connection may provide for double sided cooling as illustrated in FIGS. 1-4.

As can be seen in FIG. 5A and FIG. 5B, the circuit switch 512a includes three external connections: a first connection to the collector of the transistor 516, a second connection to the emitter of the transistor 516, and a third connection to the gate of the transistor 516. In this example, a minimum number of connections are shown. It should be appreciated that a circuit switch 512a may also include other connections, such as, for voltage, current, and temperature measurements, and so on. FIG. 6A through FIG. 6E illustrate various views of a circuit switch module embodiment that implements these three external connections. The circuit switch module is generally identified with reference numeral 600. The circuit switch model 600 includes the semiconductor packaging shown in FIG. 1 and additionally includes bus bars that provide electrical connections from the semiconductor package 104 to other components external to the circuit switch 600. FIG. 6A is an isometric view of the circuit switch module 600. FIG. 6B and FIG. 6E are top and bottom views, respectively, of the circuit switch module 600. FIG. 6C and FIG. 6D are back and front views, respectively, of the circuit switch module 600.

The circuit switch module 600 includes the power semiconductor packaging as shown in FIG. 1 including a first cooling area zone 128 defined by wings 124a,b of first and second heat exchanger plates 116a,b. As in FIG. 1, the circuit switch module 600 includes a first void space 148a adjacent to the base 120a of the first heat exchanger plate 116a, and a second void space 148b adjacent to the base 120b of the second heat exchanger plate 116b. The top 132, middle 136, and bottom 140 cooling areas include a number of cooling elements 602 that exchange heat with the first and second heat exchanger plates 116a,b. In the circuit element 600 shown in FIG. 6A through FIG. 6E, cooling of the heat exchanger plates 116a,b is provided by a number of planar cooling elements 602 or heat exchangers of substantially uniform thickness, such as may be commercially available.

As shown in FIG. 6A through FIG. 6E, the circuit switch module 600 includes a first bus bar 604. The first bus bar 604 connects to the semi-conductor package 100. The first bus bar 604 provides a connection to the collector of the transistor 512a (not shown in FIG. 6A through FIG. 6E). The first bus bar 604 extends out from the top of the circuit switch module 600 in a u-shaped portion 608 that routes the bus bar 604 to an area adjacent to the back side 606 of the circuit switch module 600. Here, the u-shaped portion 608 connects with a transverse portion 612 of the bus bar 604, which is located in an area that is adjacent to the back side 606 of the circuit switch 600.

The transverse portion 612 of the bus bar 604 includes a connecter 616. The connecter 616 is disposed at least partially within the void space 148a where it meets the shaped portion 608. The connecter 616 extends from the u-shaped portion 608 in a forward direction outward from the void space 148a. The transverse portion 612 of the bus bar 604 additionally may have a stub 620 that extends from the u-shaped portion 608 for a certain distance in a rearward direction opposite from that of the connecter 616. As described in greater detail below, the stub 620 of the bus bar 604 may be cooled through the operation of one or more cooling elements which are integrated into the semiconductor packaging of the circuit switch module 600.

The circuit switch module 600 also includes a second bus bar 624 that connects to the collector of the transistor 512a. The second bus bar 624 extends out from the bottom of the circuit switch module 600 in a u-shaped portion 628 that routes the second bus bar 624 to an area adjacent to the front side 632 of the circuit switch module 600. Here, the u-shaped portion 628 connects with a transverse portion 636 having a connecter 640 that extends in a forward direction and a stub 644 that extends in a rearward direction. The connecter 640 extends outward from the void space 148b. The stub 644 extends in an opposite direction from that of the connecter 640 and may be cooled by contact with a cooling element 602.

The circuit switch module 600 also includes a control signal bus bar 648 that connects to the gate of the transistor 512a. The control signal bus bar 648 extends out from the bottom of the circuit switch module 600 in a u-shaped portion 652 that routes the control bus bar 648 to the area adjacent to the front side 636 of the circuit switch module 600. Here, the u-shaped portion 652 connects with a transverse portion 656 having a connecter 660 that extends in a forward direction. The connecter 660 extends outward from the void space 148b. The first bus bar 604 and the second bus bar 624 carry higher amounts of current than the control signal bus bar 648. Accordingly, the first bus bar 604 and the second bus bar 624 may have a greater thickness when compared to that of the control signal bus bar 648.

It should be appreciated that the bus bar routing shown in FIG. 6A through FIG. 6E is by way of example and not limitation. Generally, the bus bars may be routed multiple different ways. The bus bars may be routed to opposite sides of the package as shown in FIG. 6A through FIG. 6E; or, alternatively, the bus bars may be routed to the same side of the package 104. If routed to the same side of the package 104, the bus bars could be stacked or placed side-by-side. The desired layout for a given implementation may depend on packaging, electrical performance, and losses.

As shown in FIG. 6A through FIG. 6E, external circuit connections may be made on one lateral side of the semiconductor package 104, while cooling of the semiconductor package takes place on another lateral side of the semiconductor package 104. In accordance with other embodiments, cooling may take place on two lateral sides of the semiconductor package 104, including one of the lateral sides used to provide external electrical connections. FIG. 7A through FIG. 7E are schematic illustrations of a circuit module 700 that includes the power semiconductor packaging as shown in FIG. 3 and that additionally includes a number of bus bars. FIG. 7A is an isometric view of the circuit switch module 700. FIG. 7B and FIG. 7E are top and bottom views, respectively, of the circuit switch module 700. FIG. 7C and FIG. 7D are back and front views, respectively, of the circuit switch module 700.

The circuit switch module 700 includes the semiconductor packaging as shown in FIG. 3 including a first cooling zone 128 and a second cooling zone 304. The first cooling zone is defined by wings 124a,b of first and second heat exchanger plates 116a,b. The second cooling zone is defined by wings 308a,b of the first and second heat exchanger plates 116a,b. As in FIG. 3, the circuit switch module 700 includes a first void space 148a adjacent to the base 120a of the first heat exchanger plate 116a; and second void space 148b adjacent to the base 120b of the second heat exchanger plate 116b. The top 132, middle 136, and bottom 140 cooling areas of the first cooling zone 128 include a number of cooling elements 602 that exchange heat with the first and second heat exchanger plates 116a,b. Similarly, the top 132, middle 136, and bottom 140 cooling areas of the second cooling zone 304 include a number of cooling elements 602 that exchange heat with the first and second heat exchanger plates 116a,b. As described in connection with FIG. 4, the first 128 and second 304 cooling zones may be used together or separately to remove heat from the semiconductor package 104.

The circuit switch module 700 additionally includes first 604 and second 608 bus bars routed as described in connection with FIG. 6A through FIG. 6E. Specifically, the first bus bar 604 includes a u-shaped portion 608 connected to a transverse portion 612 having a connector 616 and a stub 620. Similarly, the second bus bar 624 includes a u-shaped portion 628 connected to a transverse portion 636 having a connector 640 and a stub 644. The first bus bar 604 is routed to an area adjacent to the back side 606 of the circuit switch module 700, and the second bus bar 624 is routed to the front side 636 of the circuit switch module 700. The circuit switch module 700 shown in FIG. 7A through FIG. 7E additionally includes a control signal bus bar 648 routed as described in connection with FIG. 6A through FIG. 6E. Specifically, the control bus bar 648 includes a u-shaped portion 652 connected to a transverse portion 656 having a connector 660. Due to the additional length added to the circuit switch module 700 by the second cooling zone 304, the connectors 616, 640, and 660 may be longer in the circuit switch module 700 when compared to that of the circuit switch module 600.

Like the circuit switch module 600 shown in FIG. 6A through FIG. 6E, the circuit switch module 700 includes a first cooling zone 128, which may cool the stubs 620, 644 of the first 604 and second 624 bus bars. In addition to this first cooling zone 128, the circuit module 700 includes a second cooling zone 304. The second cooling zone 304 may have cooling elements 602 that cool the connectors 616, 640 of the first 604 and second 624 bus bars, and the connector 660 of the control signal bus bar 648. Bus bar cooling is described in greater detail below.

Bus Bar Cooling

Figure 8A:
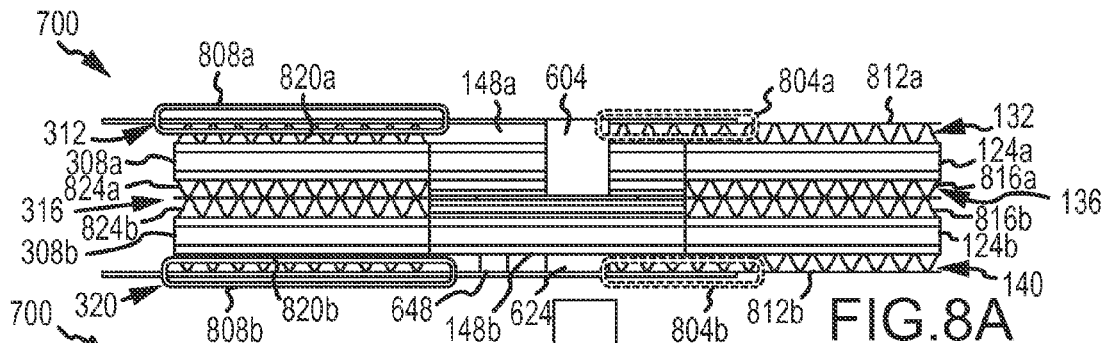
FIG. 8A is a top view of the circuit element shown in FIG. 7A showing bus bar cooling areas.
Figure 8B:
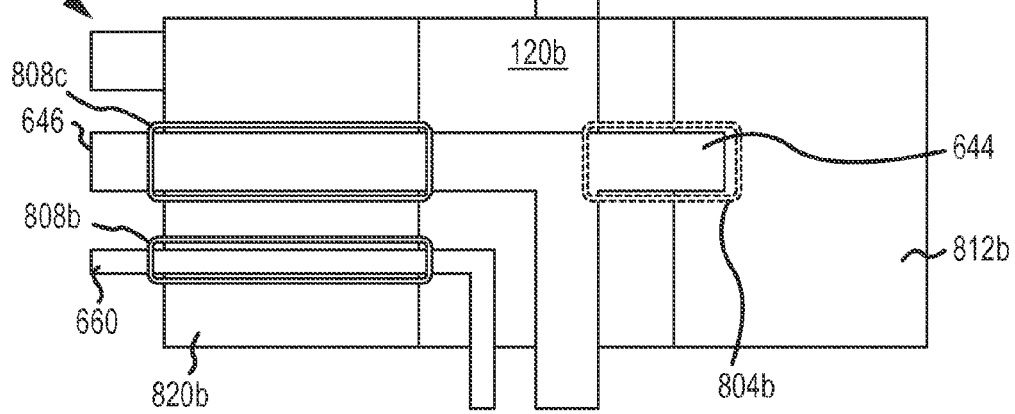
FIG. 8B is a front view of the circuit element shown in FIG. 7A showing bus bar cooling areas.

FIG. 8A and FIG. 8B are enlarged schematic illustrations of the circuit element 700 shown in FIG. 7A through FIG. 7E. FIG. 8A is a top view of the circuit switch module 700. FIG. 8B is a front view of the circuit switch module 700. As mentioned above, cooling of the heat exchanger plates 116a,b may be provided by a number of planar cooling elements or heat exchangers of substantially uniform thickness. A number of such cooling elements are illustrated in FIG. 8A and FIG. 8B. Specifically, cooling elements 816a,b contact the first sides of the first and second heat exchanger plate 116a,b at the wings 124a,b; while the cooling elements 812a,b contact the second sides of the first and second heat exchanger plates 116a,b at the wings 124a,b. Additionally, cooling elements 824a,b contact the first sides of the first and second heat exchanger plate 116a,b at the wings 308a,b; while the cooling elements 820a,b contact the second sides of the first and second heat exchanger plates 116a,b at the wings 308a,b. In addition to cooling the heat exchanger plates 116a,b, some of the cooling elements provide cooling for the first 604 and second 624 bus bars and for the control signal bus bar 648.

The transverse portion 612 of the first bus bar 604 may include a rear stub 620 that extends from the u-shaped portion 608 for a certain distance in a rearward direction opposite from that of the connector 616. Similarly, the transverse portion 636 of the second bus bar 624 may include a stub 644 that extends from the u-shaped portion 628 for a certain distance in a rearward direction opposite from that of the connector 646. As indicated by areas 804a,b in FIG. 8A and FIG. 8B, the stubs 620, 644 may be cooled by contact with certain cooling elements. Area 804a, which can be seen in FIG. 8A, indicates contact between the cooling element 804a and the stub 620 of the first bus bar 604. Area 804b, which can be seen in FIG. 8A and FIG. 8B, indicates contact between the cooling element 804b and the stub 644 of the second bus bar 624. Electrical insulation may be employed, as appropriate, such that electrical current does not flow between the stub 620 and the cooling element 804a and between the stub 644 and the cooling element 804b.

The transverse portions 612, 636 of the first 604 and second 624 bus bars may include connectors 616, 646 that extend from the u-shaped portions 608, 628 for a certain distance in a forward direction opposite from that of the stubs 620, 644. Similarly, the transverse portion 656 of the control signal bus bar 648 may include a connector 660 that extends from the u-shaped portion 652 for a certain distance in a forward direction substantially parallel to the transverse portion 636 of the second bus bar 624. As indicated by areas 808a-c in FIG. 8A and FIG. 8B, the connectors 616, 646, 660 may be cooled by contact with certain cooling elements. Area 808a, which can be seen in FIG. 8A, indicates contact between the cooling element 820a and the connector 616 of the first bus bar 604. Area 808b, which can be seen in FIG. 8A and FIG. 8B, indicates contact between the cooling element 820b and the connector 660 of the control signal bus bar 648. Area 808c, which can be seen in FIG. 8B, indicates contact between the cooling element 820b and the connector 646 of the second bus bar 624. As with the stub 620, 644, electrical insulation may be employed, as appropriate, such that electrical current does not flow between components.

Cooling of electrical leads such as bus bars serves to isolate heat from other electrical components such as low voltage electronics or capacitors. As can be appreciated from the foregoing, the extent of bus bas cooling may depend on power semiconductor packaging embodiment that is used in a given application. As explained above, different embodiments may employ different bus bar routings. If the power semiconductor packaging shown in FIG. 1 is used, the stub 620, 644 portions of the first 604 and second 624 bus bars may be cooled. If the power semiconductor packaging shown in FIG. 3 is used, both the stubs 620, 644 and the connectors 616, 648 of the first 604 and second 624 bus bars may be cooled. Additionally, in this instance, the connector 660 of the control signal bus bar 648 may be cooled.

Direct Cooling of the Semiconductor Package

Figure 9A:
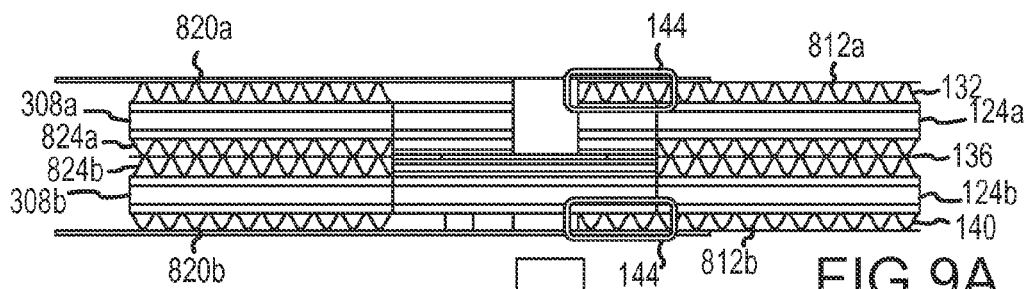
FIG. 9A is a top view of the circuit element shown in FIG. 7A showing an area of overlap of a cooling element and the power electronics package.
Figure 9B:
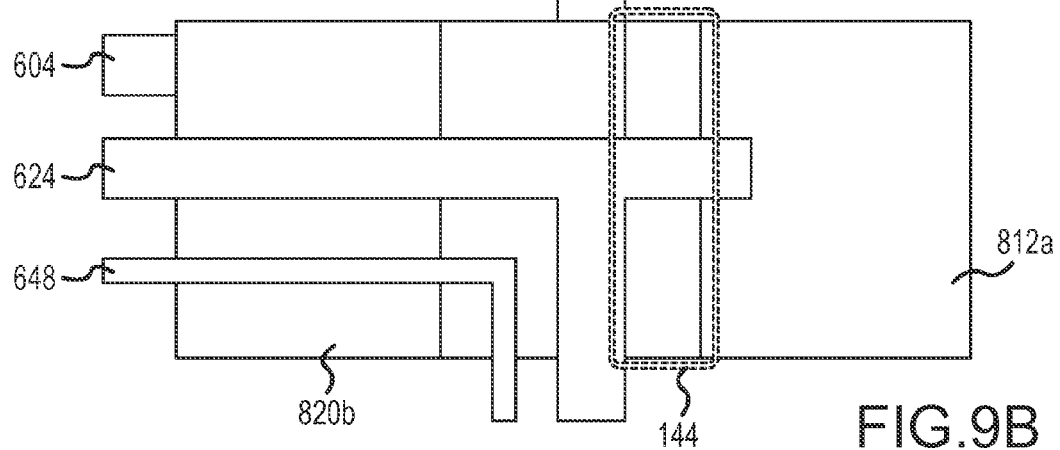
FIG. 9B is a front view of the circuit element shown in FIG. 7A showing an area of overlap of a cooling element and the power electronics package.

As mentioned above, in some embodiments, the cooling element 100 includes an overlap area 144 inside of which the top cooling area 132 contacts a portion of the base 120a of the first heat exchanger plate 116a, and the bottom cooling area 140 contacts a portion of the base 120b of the second heat exchanger plate 116b. This overlap area 144 is shown in greater detail in FIG. 9A and FIG. 9B, which are enlarged schematic illustrations of the circuit element 700 shown in FIG. 7A through FIG. 7E. FIG. 9A is a top view of the circuit switch module 700. FIG. 9B is a front view of the circuit switch module 700.

The overlap area 144 is illustrated in both FIG. 9A and FIG. 9B. As can be seen, the cooling element 812a contacts a portion of the base 120a of the first heat exchanger plate 116a. Similarly, the cooling element 812b contacts a portion of the base 120b of the second heat exchanger plate 116b. In this embodiment, the cooling elements 812a,b provide for direct cooling of at least a portion of the semiconductor package 104. Specifically, at least some heat may be transferred out of the first and second heat exchanger plates 116a,b without the heat moving along the lengths of the first and second heat exchanger plates 116a,b to points that are laterally adjacent to the semiconductor package 104.

Modular Half-Bridge Implementation

Figures 10A, 10B:
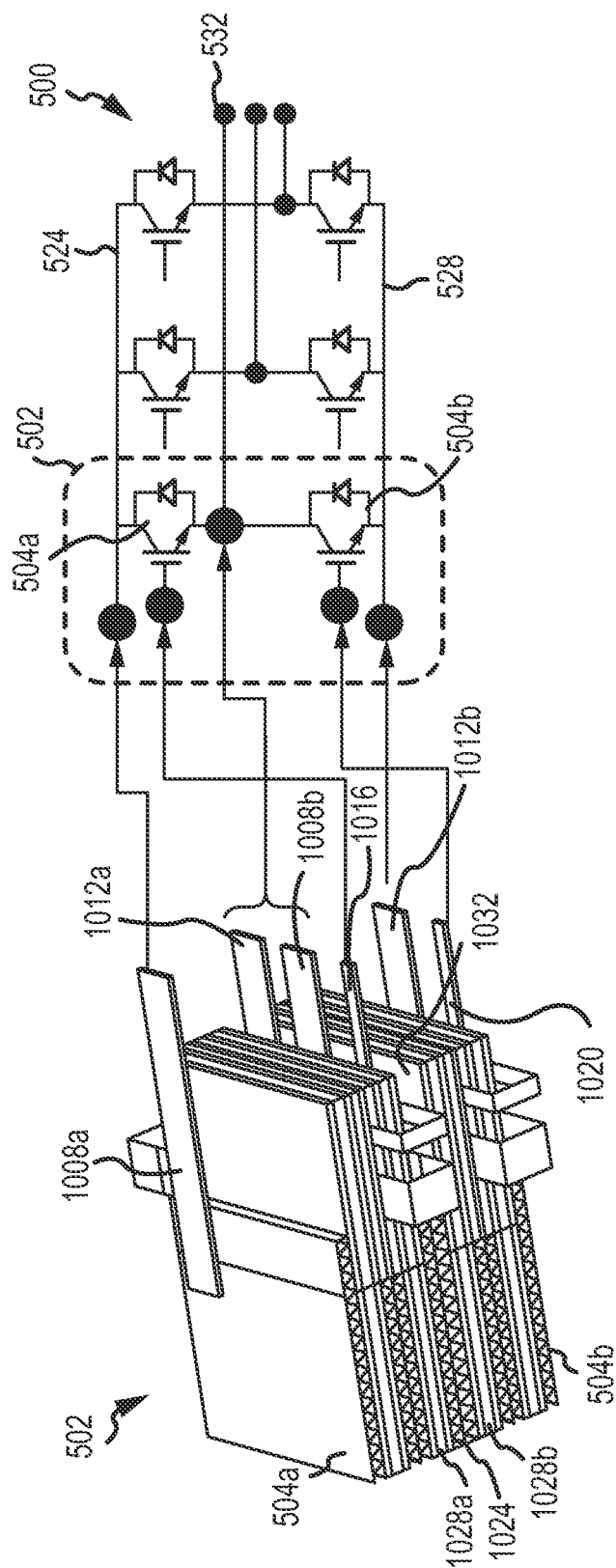
FIG. 10A is an isometric view of a half-bridge that includes a stacked arrangement of two of the circuit elements of shown in FIG. 6A.
FIG. 10B is circuit diagram for a voltage source three-phase inverter that highlights the half-bridge portion including connection points corresponding to the half-bridge shown in FIG. 10A.

As mentioned above, power semiconductor packaging in accordance with embodiments discussed herein may be used to package the circuit switches used in the three-phase inverter shown in FIG. 5A. In this regard, two circuit switches that make up a circuit stage may be individually packaged and connected to each other in a stacked arrangement to form a half-bridge. FIG. 10A is an isometric illustration of a half-bridge 502 constructed in this manner. FIG. 10B is a circuit diagram showing the interconnection among components of a three-phase inverter 500, including the half-bridge illustrated in FIG. 10A.

The half-bridge 502 illustrated in FIG. 10A includes a first switch module 504a and a second switch module 504b interconnected to each other in a stacked arrangement. The half-bridge 502 includes a cooling element 1024 that is connected on one side to a heat exchanger plate 1028a of the first switch module 504a, and is connected on an opposing side to a heat exchanger plate 1028b of the second switch module 504b. A void space 1032 exists between the first and second modules 504a,b because the cooling element 1024 does not connect to the heat exchanger plates 1028a,b along an entirety of their lengths.

The first and second modules 504a,b include a number of bus bars that are routed as generally described in connection with FIG. 6A through FIG. 6E. The first module 504a includes first and second bus bars 1008a,b that are routed to opposite sides of the first module 504a. Similarly, the second module 504b includes first and second bus bars 1012a,b that are routed to opposite sides of the second module 504a. The first module 504a additionally includes a control signal bus bar 1016 that is routed to the same side of the first module 504a as the second bus bar 1008b. Similarly, the second module 504b additionally includes a control signal bus bar 1020 that is routed to the same side of the second module 504b as the second bus bar 1012b.

As can be seen in FIG. 10A, at least one bus bar from each of the first and second modules 504a,b is routed through the void space 1032 that exists between the modules 504a,b. Specifically, the first bus bar 1012a of the second module 504b, and the second bus bar 1008b of the first module 504a are routed through the void space 1032. Additionally, the control bus bar 1016 of the first module 504a is routed through the void space 1032.

The connections made by the various bus bars can be seen in FIG. 10B. For example, the first bus bar 1008a of the first module 504a attaches to the collector of the transistor of the first module 504a. The second bus bar 1012b of the second module 504b connects to the emitter of the transistor of the second module 504b. When interconnected with other half-bridge modules the first bus bar 1008a forms a portion the voltage rail 524 that connects the various stages. Similarly, the second bus bar 1012b forms a portion of the voltage rail 528 that also connects the various stages. As described above in connection with FIG. 5A and FIG. 5B, when an inverter constructed from a number of half-bridges is employed in an electric vehicle, the first bus bar 1008a and the second bus bar 1012b may provide a connection to the direct current portion of the electric vehicle.

As can also be seen from FIG. 10B, the second bus bar 1008b of the first module 504a attaches to the emitter of the transistor of the first module 504a. The first bus bar 1012a of the second module 504b attaches to the collector of the transistor of the second module 504b. When interconnected with other half-bridge modules, the second bus bar 1008b and the first bus bar 1012a together form a signal phase 532 of a three-phase inverter output. As described above in connection with FIG. 5A and FIG. 5B, when an inverter constructed from a number of half-bridges is employed in an electric vehicle, the second bus bar 1008b and the first bus bar 1012a may provide a connection to the alternating current portion of the electric vehicle.

It is also noted that the cooling element 1024 may be implemented as two separate cooling elements that each contact a heat exchanger plate 1028a,b. A space may exist between the two separate cooling elements that can accommodate a bus bar stub. Here, the bus bar stub may be cooled on both sides by contact with a separate cooling element. Although not explicitly labeled in FIG. 10A, the half-bridge module 502 may contain components such as additional cooling elements, heat exchanger plates, thermal insulating layers, and so on that are described in greater detail in connection with other figures.

Comparative Data

Two sample designs using the described embodiments were developed and the thermal performance results were compared against commercial baseline cooling designs using finite element analysis (FEA) models in ANSYS Workbench. The models represent a liquid cooled and air cooled design. The results were compared against other cooling options in terms of size and cost. The size is compared based on estimates for the resulting inverter power density (kW/L), and the cost impact is indicated using the total power per total IGBT die (silicon) area (kW/cm$^2$).

Figure 11:
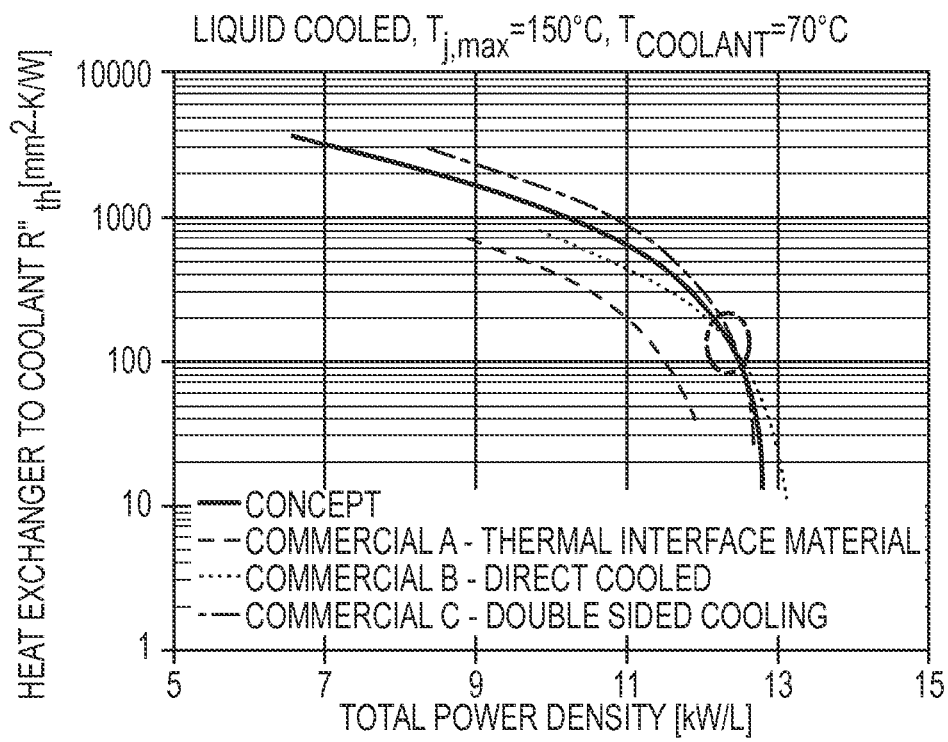
FIG. 11 is graphical illustration of a power density comparison between a liquid cooled embodiment and three prior art liquid cooled circuit elements.
Figure 12:
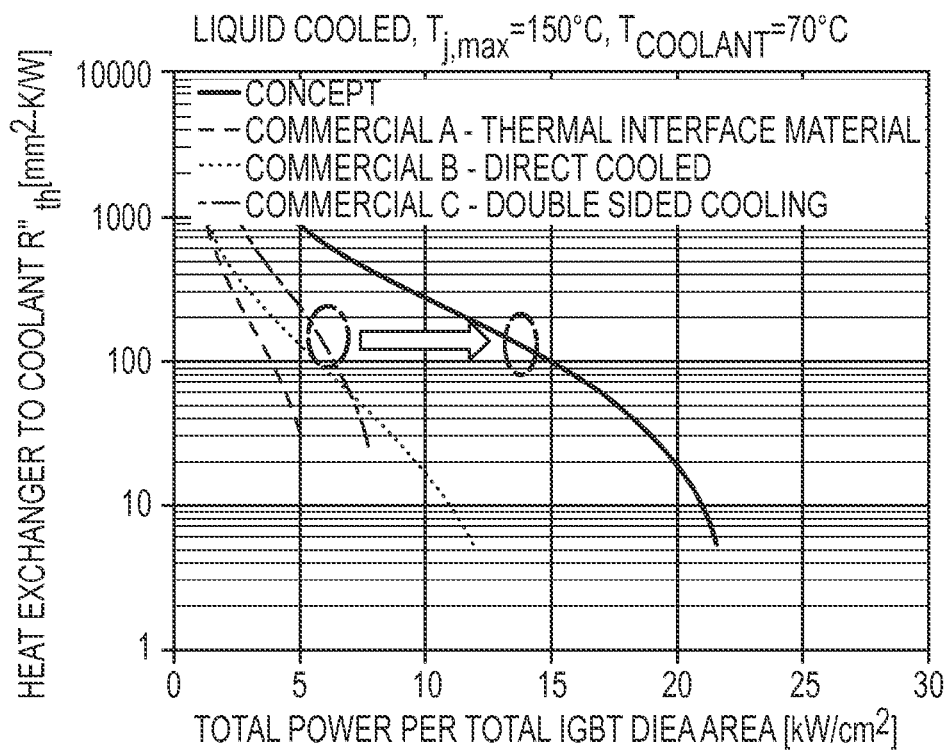
FIG. 12 is graphical illustration of a power per transistor area comparison between a liquid cooled embodiment and three prior art liquid cooled circuit elements.

FIG. 11 and FIG. 12 show the results of a comparison between a non-optimized liquid cooled design in accordance with embodiments described herein and three commercially available packages. In FIG. 11 and FIG. 12, "Commercial A" is a baseline commercial package that employs a heat sink in combination with a heat spreader and thermal interface material (TIM). "Commercial B" is a commercial package that dispenses with the heat sink and TIM to directly cool the heat spreader. "Commercial C" is a commercial package that applies double sided cooling directly to the semiconductor package.

FIG. 11 demonstrates that the proposed concept achieves a similar power density (kW/L) as "Commercial B" and "Commercial C", the more advanced comparison cases, and it significantly out performs the current conventional packaging approach (Commercial A). This example application is not optimized so additional improvements would be expected in a final design.

The cost impact of the different cooling approaches, as indicated by total power per total IGBT die (silicon) area, is illustrated in FIG. 12. As can be seen in FIG. 12, the proposed concept achieves over a 100% (124-130%) improvement in power per die area for the same IGBT die area over the expected liquid cooling performance range of 100-200 mm$^2$-K/W.

Figure 13:
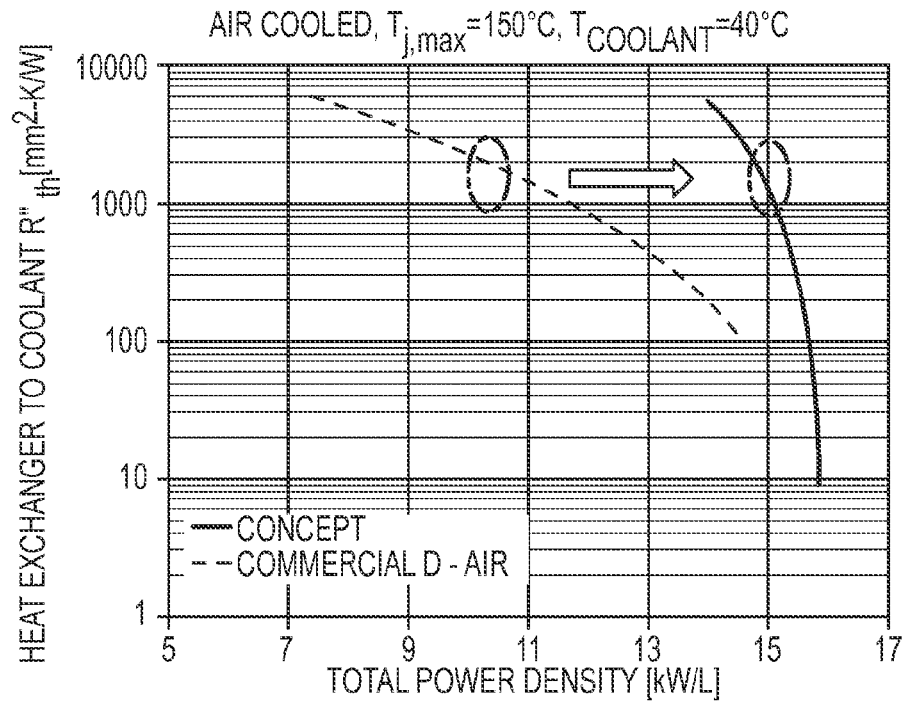
FIG. 13 is graphical illustration of a power density comparison between an air cooled embodiment and one prior art air cooled circuit elements.
Figure 14:
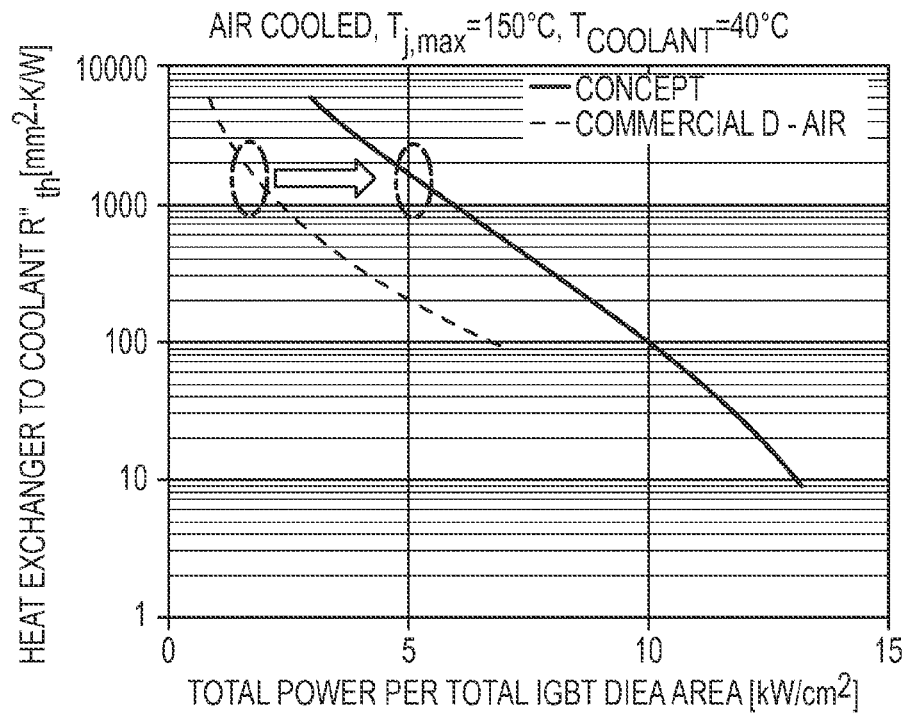
FIG. 14 is graphical illustration of a power per transistor area comparison between an air cooled embodiment and one prior art air cooled circuit elements.

FIG. 13 and FIG. 14 show the results of a comparison between a non-optimized air cooled design in accordance with embodiments described herein and a commercially available package. The air cooled example embodiment uses a single cooling zone with a larger cooled surface. The air cooled comparison system is based on a commercially available air cooled inverter.

FIG. 13 demonstrates that the example embodiments achieves a significant increase in power density for an equivalent air cooled heat exchanger performance between 1000-2000 mm$^2$-K/W. The design also shows the ability to reduce the heat exchanger performance (>2000 mm$^2$-K/W) while still enabling a high power density.

The relative cost benefit of the concept design is seen in FIG. 14, as indicated by the increased power per total IGBT area. The concept design shows a 180-230% increase in power for an equivalent silicon area over the listed heat exchanger performance values (1000-2000 mm$^2$-K/W). This example application is not optimized so additional improvements would be expected in a final design. Air cooling for power electronics faces both cost and size challenges. The proposed concept shows the ability to improve performance of an air cooled system with respect to both these challenges.

Finally, it should be noted that there are alternative ways of implementing the embodiments disclosed herein. While a number of exemplary aspects and embodiments have been discussed above, those of skill in the art will recognize certain modifications, permutations, additions and sub combinations thereof. Accordingly, the present embodiments are to be considered as illustrative and not restrictive. Furthermore, the claims are not to be limited to the details given herein, and are entitled their full scope and equivalents thereof. The drawings are not intended to limit the application of the concept. For example, the bus bar layout is only intended as an example, and it can be adjusted to meet the desired application requirements. Also, the size of the heat spreader plate and fins are intended as an example. The actual sizing would require optimization for the intended application.

The invention claimed is:

1. A circuit element, comprising:
a semiconductor package having opposing first and second sides;
a heat exchanger plate having opposing first and second sides, the first side of the semiconductor package connected to the first side of the heat exchanger plate at a base of the heat exchanger plate, the heat exchanger plate having a wing not connected to the semiconductor package, the wing integrally formed with the base of the heat exchanger plate and extending from the base beyond a first edge of the semiconductor package;
the base of the heat exchanger plate in thermal communication with the semiconductor package such that heat generated in the semiconductor package flows out through the first side of the semiconductor package into the base of the heat exchanger plate;
the wing of the heat exchanger plate in thermal communication with the base of the heat exchanger plate such that heat in the base flows into the wing; and
a cooling element connected to the first side of the heat exchanger plate at the wing of the heat exchanger plate, the cooling element in thermal communication with the wing of the heat exchanger plate such that heat in the wing flows into the cooling element.

2. The circuit element of claim 1, wherein the heat exchanger plate is a first heat exchanger plate, the circuit element further comprising:
a second heat exchanger plate having opposing first and second sides, the second side of the semiconductor package connected to the second heat exchanger plate at a base of the second heat exchanger plate, the second heat exchanger plate having a wing not connected to the semiconductor package, the wing integrally formed with the base of the second heat exchanger plate and extending from the base beyond the first edge of the semiconductor package; wherein
the base of the second heat exchanger plate is in thermal communication with the semiconductor package such that heat generated in the semiconductor package flows out through the second side of the semiconductor package into the base of the second heat exchanger plate;
the wing of the second heat exchanger plate is in thermal communication with the base of the second heat exchanger plate such that heat in the base flows into the wing; and
the cooling element is additionally connected to the first side of the second heat exchanger plate at the wing of the second heat exchanger plate, the cooling element in thermal communication with the wing of the second heat exchanger plate such that heat in the wing of the second heat exchanger plate flows into the cooling element.

3. The circuit element of claim 2, wherein the cooling element is a first cooling element, the circuit element further comprising:
a second cooling element connected to the second side of the first heat exchanger plate at the wing of the first heat exchanger plate, the second cooling element in thermal communication with the wing of the first heat exchanger plate such that heat in the wing of the first heat exchanger plate flows into the second cooling element; and
a third cooling element connected to the second side of the second heat exchanger plate at the wing of the second heat exchanger plate, the second cooling element in thermal communication with the wing of the second heat exchanger plate such that heat in the wing of the second heat exchanger plate flows into the third cooling element.

4. The circuit element of claim 3, wherein:
the second cooling element is additionally connected to the second side of the first heat exchanger plate at a portion of the base of the first heat exchanger plate, the second cooling element in thermal communication with the base of the first heat exchanger plate such that heat in the base of the first heat exchanger plate flows into the second cooling element; and
the third cooling element is additionally connected to the second side of the second heat exchanger plate at a portion of the base of the second heat exchanger plate, the second cooling element in thermal communication with the base of the second heat exchanger plate such that heat in the base of the second heat exchanger plate flows into the third cooling element.

5. The circuit element of claim 3, wherein the wing of the first heat exchanger plate is a first wing of the first heat exchanger plate, and the wing of the second heat exchanger plate is a first wing of the second heat exchanger plate, the circuit element further comprising:
a second wing of the first heat exchanger plate not connected to the semiconductor package, the second wing integrally formed with the base of the first heat exchanger plate and extending from the base beyond a second edge of the semiconductor package, the second wing of the first heat exchanger plate in thermal communication with the base of the first heat exchanger plate such that heat in the base flows into the second wing;
a second wing of the second heat exchanger plate not connected to the semiconductor package, the second wing integrally formed with the base of the second heat exchanger plate and extending from the base beyond the second edge of the semiconductor package, the second wing of the second heat exchanger plate in thermal communication with the base of the second heat exchanger plate such that heat in the base flows into the second wing; and a fourth cooling element connected to the first side of the first heat exchanger plate at the second wing of the first heat exchanger plate, the fourth cooling element additionally connected to the first side of the second heat exchanger plate at the second wing of the second heat exchanger plate, the fourth cooling element in thermal communication with the second wings of the first and second heat exchanger plates such that heat in the second wings of the first and second heat exchanger plates flows into the fourth cooling element.

6. The circuit element of claim 5, further comprising:

a fifth cooling element connected to the second side of the first heat exchanger plate at the second wing of the first heat exchanger plate, the fifth cooling element in thermal communication with the second wing of the first heat exchanger plate such that heat in the second wing of the first heat exchanger plate flows into the fifth cooling element; and a sixth cooling element connected to the second side of the second heat exchanger plate at the second wing of the second heat exchanger plate, the sixth cooling element in thermal communication with the second wing of the second heat exchanger plate such that heat in the second wing of the second heat exchanger plate flows into the sixth cooling element.

7. The circuit element of claim 1, wherein the cooling element comprises:

a flow passage configured to receive a flow of coolant there through; and one or more heat transfer surfaces within the flow passage.

8. A method of cooling a power electronics switch in an electric vehicle, comprising:

generating heat in a semiconductor portion of a power electronics switch by passage of current through the switch between a first electric subsystem and a second electric subsystem of an electric vehicle;

removing heat from the semiconductor by passage of heat through a surface of the semiconductor into a base of a heat exchanger plate;

removing heat from the base of the heat exchanger plate by passage of heat along a length of the heat exchanger plate into a wing of the heat exchanger plate; and removing heat from the wing of the heat exchanger plate by passage of heat through first and second opposing surfaces of the wing of the heat exchanger plate.

9. A circuit element, comprising:

a semiconductor package having opposing first and second sides;

a heat exchanger plate connected to the first side of the semiconductor package at a base of the heat exchanger plate, the base of the heat exchanger plate in thermal communication with the semiconductor package such that heat generated in the semiconductor package flows out through the first side of the semiconductor package into the base of the heat exchanger plate;

the heat exchanger plate having a first wing not connected to the semiconductor package, the first wing integrally formed with the base of the heat exchanger plate and extending from the base beyond a first edge of the semiconductor package, the first wing of the heat exchanger plate in thermal communication with the base of the heat exchanger plate such that heat in the base flows into the first wing;

the heat exchanger plate having a second wing not connected to the semiconductor package, the first wing integrally formed with the base of the heat exchanger plate and extending from the base beyond a second edge of the semiconductor package, the second wing of the heat exchanger plate in thermal communication with the base of the heat exchanger plate such that heat in the base flows into the second wing;

a first cooling element connected to the first heat exchanger plate at the first wing of the heat exchanger plate, the first cooling element in thermal communication with the first wing of the heat exchanger plate such that heat in the first wing flows into the first cooling element; and a second cooling element connected to the heat exchanger plate at the second wing of the heat exchanger plate, the second cooling element in thermal communication with the second wing of the heat exchanger plate such that heat in the second wing flows into the second cooling element.

10. The circuit element of claim 9, wherein the first cooling element includes a flow passageway that is configured to receive a flow of liquid coolant there through; and the second cooling element includes a flow passageway that is configured to receive a flow of gaseous coolant there through.

11. The circuit element of claim 9, wherein the heat exchanger plate has opposing first and second sides;

the first cooling element is connected to the first side of the first heat exchanger plate at the first wing of the heat exchanger plate, and the second cooling element connected to the first side of the first heat exchanger plate at the second wing of the heat exchanger plate.

12. The circuit element of claim 11, wherein the heat exchanger plate is a first heat exchanger plate, the circuit element further comprising:

a second heat exchanger plate connected to the second side of the semiconductor package at a base of the second heat exchanger plate, the base of the second heat exchanger plate in thermal communication with the semiconductor package such that heat generated in the semiconductor package flows out through the second side of the semiconductor package into the base of the second heat exchanger plate;

the second heat exchanger plate having a first wing not connected to the semiconductor package, the first wing integrally formed with the base of the second heat exchanger plate and extending from the base beyond the first edge of the semiconductor package, the first wing of the second heat exchanger plate in thermal communication with the base of the heat exchanger plate such that heat in the base flows into the first wing; and the second heat exchanger plate having a second wing not connected to the semiconductor package, the second wing integrally formed with the base of the second heat exchanger plate and extending from the base beyond the second edge of the semiconductor package, the second wing of the second heat exchanger plate in thermal communication with the base of the heat exchanger plate such that heat in the base flows into the second wing; wherein the first cooling element is connected to the second heat exchanger plate at the first wing of the second heat exchanger plate, the first cooling element in thermal communication with the first wing of the second heat exchanger plate such that heat in the first wing flows into the first cooling element; and the second cooling is element connected to the second heat exchanger plate at the second wing of the second heat exchanger plate, the second cooling element in thermal communication with the second wing of the second heat exchanger plate such that heat in the second wing flows into the second cooling element.

13. A method of cooling a power electronic switch in a electric vehicle, comprising:

driving a first current through a power electronics switch;

removing heat generated in the power electronics switch by the first current by passing a first coolant fluid through a first cooling element;

driving a second current through the power electronics switch;

removing heat generated in the power electronics switch by the second current by passing the first coolant fluid through the first cooling element and by passing a second coolant fluid through a second cooling element.

14. The method of claim 13, wherein the first current is generated by charging a battery of the electric vehicle;

the first coolant fluid is air provided by a fan of the electric vehicle or natural convection;

the second current is generated by operating an electric motor of the electric vehicle, and the second coolant fluid is liquid or air provided by a vehicle cooling system.

15. A circuit element, comprising:

a first module comprising a semiconductor package and a heat exchanger plate connected to the semiconductor package at a base of the heat exchanger plate, the heat exchanger plate having a wing not connected to the semiconductor package, the wing integrally formed with the base of the heat exchanger plate and extending from the base beyond a first edge of the semiconductor package;

a second module comprising a semiconductor package and a heat exchanger plate connected to the semiconductor package at a base of the heat exchanger plate, the heat exchanger plate having a wing not connected to the semiconductor package, the wing integrally formed with the base of the heat exchanger plate and extending from the base beyond a first edge of the semiconductor package; and a cooling element connected to the first and second modules in a stacked arrangement such that the wing of the heat exchanger plate of the first module is connected to a first side of the cooling element, and a second side of the cooling element is connected to the wing of heat exchanger plate of the second module; wherein the cooling element is not connected to a least a portion of the base of the heat exchanger plate of the first module and not connected to at least a portion of the base of the heat exchanger plate of the second module such that a void space exists adjacent the cooling element and between the bases of the heat exchanger plates of the first and second modules.

16. The circuit element of claim 15, further comprising:

a thermal insulating layer disposed between the void space and the base of the heat exchanger plate of the first module.

17. The circuit element of claim 15, wherein the first module includes a bus bar comprising:

a u-shaped portion connected to a second edge of the semiconductor package of the first module, the first and second edges of the semiconductor package of the first module being perpendicular, the u-shape portion extending from the second edge of the semiconductor package of the first module into the void space between the bases of the heat exchanger plates of the first and second modules; and a transverse portion integrally formed with the u-shaped portion, the transverse portion extending from within the void space beyond a third edge of the semiconductor package of the first module, the first and third edges of the semiconductor package of the first module being parallel.

18. The circuit element of claim 17, wherein the cooling element comprises a first cooling element connected to the heat exchanger plate of the first module; and a second cooling element connected to the heat exchanger plate of the second module;

wherein the transverse portion of the bus bar extends from within the void space into a space between the first and second cooling elements.

19. The circuit element of claim 17, wherein the semiconductor package of the second module has second and third sides, the first and third sides of the semiconductor package of the second module being parallel, the cooling element is a first cooling element, the circuit element further comprising:

second and third cooling elements connected to the first and second modules in a stacked arrangement; wherein the wing of the heat exchanger plate of the first module is a first wing, the heat exchanger plate of the first module having a second wing integrally formed with the base of the heat exchanger plate and extending from the base beyond the third edge of the semiconductor package of the first module;

the wing of the heat exchanger plate of the second module is a first wing, the heat exchanger plate of the second module having a second wing integrally formed with the base of the heat exchanger plate and extending from the base beyond the third edge of the semiconductor package of the second module;

the second wing of the heat exchanger plate of the first module is connected to the second cooling element;

the second wing of the heat exchanger plate of the second module is connected to the third cooling element; and the transverse portion of the bus bar extends from within the void space through a space between the second and third cooling elements.

20. The circuit element of claim 17, wherein the first module includes an additional bus bar comprising:

a u-shaped portion connected to a fourth edge of the semiconductor package of the first module, the second and fourth edges of the semiconductor package of the first module being perpendicular, the u-shape portion extending from the fourth edge of the semiconductor package of the first module into an additional void space adjacent a side of the semiconductor package opposite from that of the void space; and a transverse portion integrally formed with the u-shaped portion, the transverse portion extending from within the additional void space beyond the third edge of the semiconductor package of the first module.

21. The circuit element of claim 20, wherein
the first module is a power electronics switch;
the semiconductor package of the first module including an insulated gate bipolar junction transistor connected in parallel with a diode;
the bus bar connected to an emitter of the transistor; and
the additional bus bar connected to a collector of the transistor.

22. The circuit element of claim 21, wherein
the second module is a second power electronics switch, the semiconductor package of the second module including an insulated gate bipolar junction transistor connected in parallel with a diode, the second module having a bus bar connected to an emitter of the transistor, the second module having an additional bus bar connected to a collector of the transistor;
the first and second modules together forming a half-bridge component of a three-phase inverter, the three-phase inverter configured to connect direct current and alternating current subsystems of an electric vehicle;
the additional bus bar of the first module providing a first connection to the direct current subsystem;
the bus bar of the second module providing a second connection to the direct current subsystem;
the bus bar of the first module and the additional bus bar of the second module providing one phase of a three-phase connection to the alternating current subsystem.

23. The circuit element of claim 22, wherein
the additional bus bar of second module comprises a u-shaped portion connected to a second edge of the semiconductor package of the second module, the first and second edges of the semiconductor package of the second module being perpendicular, the u-shape portion extending from the second edge of the semiconductor package of the second module into the void space between the bases of the heat exchanger plates of the first and second modules;
the additional bus bar of the second module further comprising a transverse portion integrally formed with the u-shaped portion, the transverse portion extending from within the void space beyond a third edge of the semiconductor package of the second module, the first and third edges of the semiconductor package of the second module being parallel;
the bus bar of the second module comprises a u-shaped portion connected to a fourth edge of the semiconductor package of the second module, the second and fourth edges of the semiconductor package of the second module being perpendicular, the u-shaped portion extending from the fourth edge of the semiconductor package of the second module into an additional void space adjacent a side of the semiconductor package opposite from that of the void space;
the bus bar of the second module further comprising a transverse portion integrally formed with the u-shaped portion, the transverse portion extending from within the additional void space beyond the third edge of the semiconductor package of the first module; and
the transverse portion of the bus bar of the first module and the transverse portion of additional bus bar of the second module being parallel to each other within the void space.

24. The circuit element of claim 22, wherein
the first module includes a control signal bus bar;
the second module includes a control signal bus bar;
the control signal bus bars of the first and second modules carry a control signal from a control system component of the electric vehicle;
when the control system component asserts the control signal, current is allowed to flow from the direct current subsystem to the alternating current subsystem through the transistors of the first and second modules; and
when the control system component de-asserts the control signal, current is allowed to flow from the alternating current subsystem to the direct current subsystem through the diodes of the first and second modules.

25. The circuit element of claim 24, wherein
the control signal bus bar of the first module comprises a u-shaped portion connected to the second edge of the semiconductor package of the first module, the u-shaped portion extending from the second edge of the semiconductor package of the first module into the void space between the bases of the heat exchanger plates of the first and second modules;
the control signal bus bar of the first module further comprising a transverse portion integrally formed with the u-shaped portion, the transverse portion extending from within the void space beyond the third edge of the semiconductor package of the first module; and
the transverse portion of the bus bar of the first module and the transverse portion of control signal bus bar of the first module being parallel to each other within the void space.

* * * * *